(12) United States Patent
Yamada et al.

(10) Patent No.: US 8,587,168 B2
(45) Date of Patent: Nov. 19, 2013

(54) ELECTRIC DEVICE MOUNTED IN ELECTRIC COMPRESSOR

(75) Inventors: Masao Yamada, Kariya (JP); Satoshi Yoshimura, Kariya (JP); Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 244 days.

(21) Appl. No.: 13/045,956

(22) Filed: Mar. 11, 2011

(65) Prior Publication Data

US 2011/0268593 A1 Nov. 3, 2011

(30) Foreign Application Priority Data

Apr. 2, 2010 (JP) .................................. 2010-86346
Feb. 15, 2011 (JP) .................................. 2011-30002

(51) Int. Cl.
*H02K 9/00* (2006.01)
(52) U.S. Cl.
USPC .................................. 310/71; 310/87; 310/43
(58) Field of Classification Search
USPC ................................................ 310/43, 71, 87
See application file for complete search history.

(56) References Cited

U.S. PATENT DOCUMENTS 4,810,917 A * 3/1989 Kumar et al. ............... 310/68 R
5,708,352 A 1/1998 Umeda et al.
6,997,687 B2 * 2/2006 Iritani ........................... 417/371
7,122,928 B2 * 10/2006 Shindo ............................ 310/89
2004/0246683 A1 12/2004 Honsberg-Riedl et al.

FOREIGN PATENT DOCUMENTS

| JP | A-02-164091 | 6/1990 |
| JP | A-02-305000 | 12/1990 |
| JP | A-H06-188345 | 7/1994 |
| JP | A-07-029647 | 1/1995 |
| JP | A-2004-259834 | 9/2004 |
| JP | A-2005-045111 | 2/2005 |
| JP | A-2006-274971 | 10/2006 |
| JP | A-2009-060746 | 3/2009 |
| JP | A-2009-203904 | 9/2009 |
| JP | A-2010-245329 | 10/2010 |

OTHER PUBLICATIONS

Office Action mailed Jul. 17, 2012 in corresponding Japanese Application No. 2011-030002 (with English translation).
Office Action dated Jun. 25, 2013 issued in corresponding CN patent application No. 201110080539.9 (and English translation).

* cited by examiner

*Primary Examiner* — Dang Le
(74) *Attorney, Agent, or Firm* — Posz Law Group, PLC

(57) ABSTRACT

An electric device includes: a circuit board arranged in cooling medium in a housing and having an electric element and an external coupling electrode, wherein the electric element is sealed in and mounted in a substrate, and the electric element is electrically coupled with the external coupling electrode; an external coupling terminal electrically coupled with the external coupling electrode; and a separation member for separating the external coupling terminal and a connection portion between the external coupling electrode and the external coupling terminal away from the cooling medium.

14 Claims, 7 Drawing Sheets

ELECTRIC DEVICE MOUNTED IN ELECTRIC COMPRESSOR

CROSS REFERENCE TO RELATED APPLICATIONS

This application is based on Japanese Patent Applications No. 2010-86346 filed on Apr. 2, 2010, and No. 2011-30002 filed on Feb. 15, 2011, the disclosures of which are incorporated herein by reference.

FIELD OF THE INVENTION

The present invention relates to an electric device mounted in an electric compressor.

BACKGROUND OF THE INVENTION

Conventionally, an electric compressor is disclosed as an example of a device, in which an electric device is mounted, in the patent document No. 1. The electric compressor includes a housing with a cooling medium suction port and a cooling medium discharge port, a compressing mechanism unit accommodated in the housing, a driving shaft rotatably supported in the housing and transmitting a driving force to the compressing mechanism unit, a stator core accommodated in the housing and arranged on an outer periphery side in a radial direction of the driving shaft, a stator coil accommodated in the housing and winded around the stator core, a rotor arranged on a center side in the radial direction of a rotation axis with respect to the stator core in the housing and rotating the driving shaft according to rotation magnetic field generated by the stator coil, a circuit board (i.e., a driving circuit) as a part of the electric device mounted on an outer wall of the housing and flowing a driving current into the stator coil in order to generate the rotation magnetic field, and a first cooling medium passage disposed between an inner wall of the housing on the circuit board side and the outer wall of the stator core and passing the cooling medium from the cooling medium inlet side to the compressing mechanism side according to cooling medium compression of the compressing mechanism unit.

Since the compressor has the above structure, the electric compressor cools the circuit board via the housing with the cooling medium, which flows through the first cooling medium passage. Further, the first cooling medium passage includes a heat insulating film with respect to the outer wall of the stator core, the heat insulating film preventing heat conduction between the cooling medium and the stator core. Thus, the electric compressor cools the circuit board sufficiently.

However, in the electric compressor disclosed in the patent document No. 1, it is necessary to mount the circuit board on an attachment surface of the outer wall of the housing in order to keep the cooling medium away from the circuit board. Accordingly, the circuit board can mainly radiate heat only from one surface thereof, which contacts the attachment surface of the housing.

To improve the cooling performance of the circuit board, it is considered that the dimensions of the circuit board are increased in order to increase a contact area with the housing. However, when the dimensions of the circuit board are increased, the dimensions of the electric compressor itself are also increased.

Thus, it is considered that the circuit board is arranged in the cooling medium of the housing so that the circuit board is directly cooled by the cooling medium. Conventionally, an electric device is disclosed in the patent document No. 2 as an example of the electric device having the circuit board arranged in the cooling medium of the housing.

In the electric device disclosed in the patent document No. 3, each circuit component (i.e., the circuit board) is electrically connected to a corresponding conduction passage of one conduction passage support (i.e., the circuit board) having flexibility. The circuit component together with the conduction passage support is arranged in a sealed space of the housing (i.e., a casing) under a condition that the flexible conduction passage support is folded. The space of the housing is filled with the non-conductive cooling medium (i.e., coolant). The cooling medium contacts all of the circuit components. Thus, the electric device is structurally compact, and the size of the device is comparatively small. Further, all of the circuit components are homogeneously and sufficiently cooled.

[Patent document No. 1] JP-A-2009-203904
[Patent document No. 2] JP-A-2005-505144

An external coupling terminal (i.e., a connection element) for electrically coupling between the circuit board disposed in the housing and an external circuit disposed on an outside of the housing is hermetically arranged on the wall of the housing in the electric device disclosed in the patent document No. 2. The circuit board and the external coupling terminal are electrically connected to each other in the housing, which is filled with the cooling medium. Thus, the connection portion between the external coupling terminal and the circuit board directly contacts the cooling medium.

When the connection portion and the external coupling terminal directly contact the cooling medium, they may corrode with some kind of cooling medium. Further, for example, when the cooling medium having conductivity is used, the connection portion and the external coupling terminal may be conductive with the cooling medium. Thus, there is possibility to arise problem of reliability when the connection portion and the external coupling terminal directly contact the cooling medium.

SUMMARY OF THE INVENTION

In view of the above-described problem, it is an object of the present disclosure to provide an electric device, and cooling performance of a circuit board is improved, and reliability of an external coupling terminal and a connection portion between the circuit board and the external coupling terminal is improved.

According to an example embodiment of the present disclosure, an electric device includes: a circuit board arranged in cooling medium in a housing and having an electric element and an external coupling electrode, wherein the electric element is sealed and mounted in the board, and the electric element is electrically coupled with the external coupling electrode; an external coupling terminal electrically coupled with the external coupling electrode; and a separation member for separating the external coupling terminal and a connection portion between the external coupling electrode and the external coupling terminal away from the cooling medium.

Thus, since the circuit board is arranged in the cooling medium, the circuit board directly contacts the cooling medium. Accordingly, the cooling performance of the circuit board is improved. Further, since the device includes the separation member for separating the external coupling terminal and the connection portion between the external coupling electrode and the external coupling terminal away from the cooling medium, the external coupling terminal and the connection portion between the circuit board and the external coupling terminal are restricted from contacting the cooling medium. Thus, even when the cooling medium having corrosion action with respect to metal is used, the external coupling terminal and the connection portion between the circuit board and the external coupling terminal are restricted from corroding. Further, even when the cooling medium having conductivity is used, the external coupling terminal and the connection portion between the circuit board and the external coupling terminal are restricted from being conductive with the cooling medium. Accordingly, the cooling performance of the circuit board is improved, and the reliability of the external coupling terminal and the connection portion between the circuit board and the external coupling terminal are improved. Specifically, not only the cooling medium having non-conductivity but also the cooling medium having corrosion action with respect to metal or the cooling medium having conductivity can be used. Thus, a degree of freedom for selecting the cooling medium is improved. Here, since the electric element is mounted on the circuit board under a condition that the electric element is sealed, the reliability of the electric element is not reduced by the cooling medium even when the cooling medium having the corrosion action with respect to metal or the cooling medium having conductivity is used.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Preferred embodiment of the present invention will be explained as follows.

First Embodiment

Figure 1:
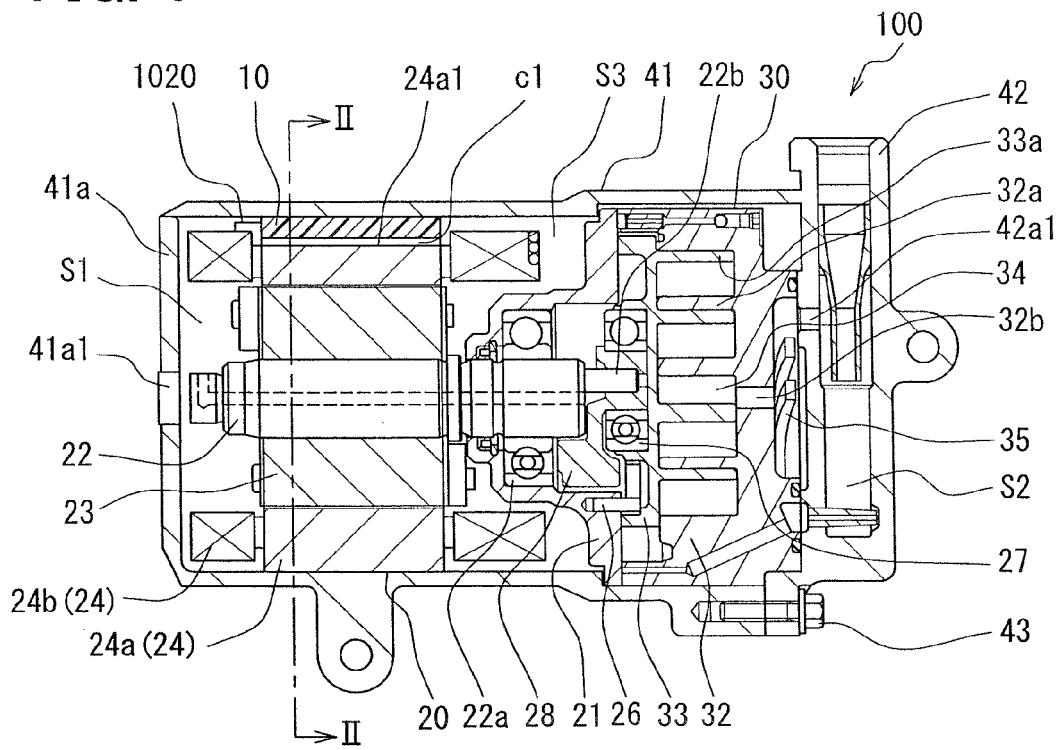
FIG. 1 is a cross sectional view showing a structure of an electric compressor 100 according to a first embodiment of the present invention.

FIG. 1 shows a structure of an electric compressor 100 according to a first embodiment. Thus, in the present embodiment, an electric device according to the present invention is applied to the electric compressor 100. The electric compressor 100 is, for example, arranged in an engine compartment of a vehicle.

The electric compressor 100 includes a first housing 41 (corresponding to a housing of the present invention) and a second housing 42 (corresponding to the housing in the present invention), which are made of aluminum or aluminum alloy having excellent heat conductivity. The first housing 41 (i.e., the housing) is a member with a bottom, which is surrounded with a bottom 41a and a side wall. A portion of the first housing 41 facing the bottom 41a is opened. In the present embodiment, the first housing 41 is a member having a cylindrical shape with a bottom as an example of the housing 41, the cylindrical shape fitting to a shape of a later described electric motor 20. Thus, the first housing 41 has a circular cross section at a virtual plane perpendicular to a driving shaft 22 of the electric motor 20. Thus, a side wall of the first housing 41 has a curved surface. In the present invention, the shape of the first housing 41 is not limited to the above shape.

The second housing 42 is arranged on an end of an opening side of the first housing 41. The first housing 41 and the second housing 42 are bonded together with a bolt 43. Thus, when the first housing 41 and the second housing 42 are bonded together, a space S3 is formed in the housing. A suction side space S1 on a bottom 41a side of the first housing 41 is formed between the bottom 41a of the first housing 41 and the electric motor 20.

The electric motor 20, a driving circuit 10 (i.e., a circuit board), a compressing mechanism unit 30, a shaft support member 21 and the like are accommodated in the space S3. The driving circuit 10 for driving the electric motor 20 is electrically coupled with the electric motor 20 and an external circuit, which is arranged on an outside of the housings 41, 42. The compressing mechanism unit 30 is driven by rotation driving force of the electric motor 20. The shaft support member 21 is arranged between the electric motor 20 and the compressing mechanism unit 30.

A suction port 41a1 (i.e., a cooling medium suction port) for sucking the cooling medium into the first housing 41 (i.e., the suction side space S1) according to cooling medium compression by the compressing mechanism unit 30 is formed in the first housing 41 (e.g., the bottom 41a). The suction port 41a1 couples between the first housing 41 (i.e., the suction side space S1) and the outside of the first housing 41.

A discharge port 42a1 (i.e., a cooling medium discharge port) for discharging the cooling medium compressed by the compressing mechanism unit 30 to the outside of the second housing 42 is formed at a position facing a later described fixed scroll 32, for example. Specifically, the discharge port 42a1 couples between the second housing 42 (i.e., a later described compression room 34) and the outside of the second housing 42. Here, the cooling medium is, for example, HFC series cooling medium, HC series cooling medium of HFO series cooling medium. Further, the cooling medium may be cooling medium having conductivity or cooling medium having corrosion action with respect to metal. Specifically, the cooling medium may be ion solution or cooling water.

Figure 2:
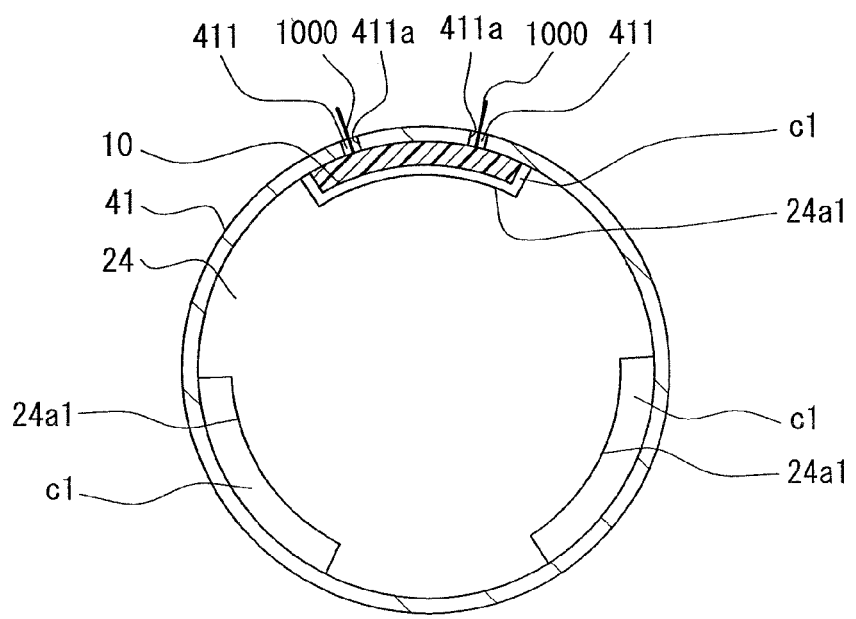
FIG. 2 is a cross sectional view of a line II-II in FIG. 1.

Further, as shown in FIG. 2, the driving circuit 10 (i.e., the circuit board) is arranged in a later described cooling medium passage c1, and further, is attached along with a shape of a curved surface (i.e., a curved shape inner surface) of an inner wall of the first housing 41. Specifically, the driving circuit 10 having a curved shape is attached to the inner wall of the first housing 41. The driving circuit 10 constitutes a circuit including an inverter and the like, which converts direct-current electric power to three-phase alternating electric power so as to supply the electric motor 20, and controls the number of rotations of the electric motor 20, the direct-current electric power being supplied from the external circuit disposed on the outside of the electric compressor 100. The driving circuit 10 is electrically coupled with the electric motor 20 via three wirings 1020 made of metal. The three wirings 1020 correspond to three phases of the electric motor 20, respectively. A cross sectional structure of the electric motor 20 is simplified for convenience and shown in FIG. 2.

A hole 411a for passing a terminal 100 made of metal therethrough hermetically is formed at a portion of the first housing 41, on which the driving circuit 10 is attached. The terminal 100 electrically couples between the driving circuit 10 and an external circuit. A sealing member 411 having insulating property is formed on the hole 411a under a condition that the terminal 1000 is arranged in the hole 411a, so that the hole 411a is in a hermetic manner (i.e., sealed). Specifically, the space S3 on an inner side of the first housing 41 is sealed from the outside of the first housing 41 so that air tightness of the space S3 is held. Here, the driving circuit 10 will be later described in detail.

As described above, the electric motor 20 in the present embodiment includes a three-phase synchronous motor driven by three phase alternating electric power supplied from the driving circuit 10, which is arranged in the first housing 41. The electric motor 20 includes the driving shaft 22, a stator 24, and a rotor 23. The driving shaft 22 is rotatably supported in the housing, and transmits rotation driving force to the compressing mechanism unit 30. The stator 24 includes a stator core 24a and a stator coil 24b, and generates rotation magnetic field by a driving current from the driving circuit 10. The stator core 24a is arranged on an outside of the driving shaft 22 in a radial direction thereof. The stator coil 24b is winded around the stator core 24a. The rotor 23 having a hollow cylindrical shape rotates the driving shaft 22 according to the rotation magnetic field generated by the stator 24, and is arranged on a center side of the driving shaft 22 in the radial direction thereof with respect to the stator core 24a.

One end of the driving shaft 22 is rotatably supported by a bearing (not shown), which is inserted and engaged on the bottom 41a of the first housing 41. The other end of the driving shaft 22 penetrates a shaft support member 21, and is rotatably supported by a bearing 22a, which is inserted and engaged in the shaft support member 21. The shaft support member 21 is, for example, a hollow member having a hexagonal shape portion (not shown) and a cylindrical portion (not shown), and the cylindrical portion is inserted and engaged into the first housing 41. The hexagonal shape portion includes an outer surface formed to have a regular hexagonal shape.

As shown in FIG. 2, a concavity 24a1 (corresponding to the first concavity in the present invention) for providing a cooling medium passage c1 between the inner wall of the first housing 41 and the outer wall of the stator core 24a is formed on the outer wall of the stator core 24a. Specifically, in the electric compressor 100 according to the present embodiment includes the cooling medium passage c1, in which the cooling medium flows, between the suction port 41a1 and the compressing mechanism unit 30 in the housing. The cross sectional shape (i.e., the cross section cut by a virtual plane perpendicular to the driving shaft 22) of the concavity 24a1 in the stator core 24a is a C-shape. Here, Although, in the present embodiment, three concavities 24a1 are formed, the present invention is not limited to this feature.

The cooling medium passage c1 (i.e., the concavity 24a1) is formed such that the passage c1 is concaved toward the center side in the radial direction of the driving shaft 22, and further, the passage c1 extends in the axial direction of the driving shaft 22. Further, the cooling medium passages c1 are arranged so as to shift in the circumferential direction around the driving shaft 22 at the same intervals. Specifically, the stator core 24a has a cross section at the virtual plane perpendicular to the driving shaft 22 to be a gear shape.

Thus, the cooling medium passage c1 extends in the axial direction of the driving shaft 22 between the inner wall of the first housing 41 and the outer wall of the stator core 24a facing the inner wall of the first housing 41. Accordingly, as shown in FIG. 1, the cooling medium passage c1 couples from the suction side space S1 to the compressing mechanism unit 30 side. The cooling medium flowing through the cooling medium passage c1 passes through the space S3, and then, is introduced into the later described compressing mechanism unit 30. Specifically, the suction side space S1 and the compression room 34 are coupled with each other via the cooling medium passage c1 and the like.

Here, since the cooling medium passage c1 is formed between the inner wall of the first housing 41 and the outer wall of the stator core 24a facing the inner wall of the first housing 41, not only the driving circuit 10 arranged in the cooling medium passage c1 but also the electric motor 20 are cooled.

Here, the compressing mechanism unit 30 will be explained. The compressing mechanism unit 30 is coupled with one end of the driving shaft 22, which penetrates the shaft support member 21. The compressing mechanism unit 30 is driven by the rotation driving force of the electric motor 20 so that the unit 30 sucks the cooling medium from the suction port 41a1, compresses the cooling medium, and discharges the cooling medium from the discharge port 42a1.

The compressing mechanism unit 30 includes a fixed scroll 32 fixed to the first housing 41, and a rotating scroll 33 arranged between the fixed scroll 32 and the electric motor 20 and facing the fixed scroll 32. An eccentric element 22b is formed on one end (an end on the compressing mechanism unit 30 side) of the driving shaft 22, and the element 22b is eccentrically arranged from the axial center line of the driving shaft 22. The eccentric element 22b and the rotating scroll 33 are coupled with each other via a bearing 27 and a bushing 28 engaged and inserted on the rotating scroll 33 the electric motor 20 side. Further, an end of a pin 26 is inserted and engaged on a surface of the shaft support member 21 on the compressing mechanism unit 30 side. The other end of the pin 26 is inserted into a concavity formed in the rotating scroll 33 on the electric motor 20 side so that the pin 26 limits rotation of the rotating scroll 33.

The fixed scroll 32 includes a fixed wrap 32a protruding to the electric motor 20 side. The rotating scroll 33 includes a rotating wrap 33a, which protrudes to a side opposite to the electric motor 20 so as to face the fixed wrap 32a of the fixed scroll 32. The compression room 34, which provides a space partitioned with the fixed wrap 32a and the rotating wrap 33a, is formed between the fixed scroll 32 and the rotating scroll 33. The discharge port 32b and the discharge valve 35 are formed at a center portion of the fixed scroll 32. The compression room 34 and the suction side space S2 are coupled with each other via the discharge port 32b, the discharge valve 35 and the discharge port 41a1.

Thus, in the electric compressor 100, when the electric power is supplied to the stator coil 24b of the electric motor 20, the rotor 23 and the driving shaft 22 rotate integrally, so that the rotating scroll 33 rotates according to the rotation of the driving shaft 22. When the rotating scroll 33 rotates, the volume of the compression room 34 formed between the fixed scroll 32 and the rotating scroll 33 is changed. The cooling medium on the outside of the first housing 41 (i.e., in an external cooling medium circuit) is sucked into the compression room 34 from the suction side space S1 via the cooling medium passage c1. Then, the cooling medium compressed in the compression room 34 is discharged to the discharge side space S2 via the discharge port 32b of the fixed scroll 32, the discharge valve 35 and the discharge port 42a1.

Next, with reference to FIGS. 2 to 4, the driving circuit 10 and the attachment structure of the driving circuit 10 with respect to the first housing 41 will be explained. As shown in FIG. 4, the driving circuit 10 includes an electric element 15 arranged on an inside of insulation substrate made of thermoplastic resin 11, an internal pad 14a (i.e., an electrode for internal connection) electrically coupled with the electric motor 20 via a wiring 1020 and arranged on the surface of the insulation substrate, an external pad 14 (i.e., an electrode for external connection) electrically coupled with an external circuit via a terminal 1000 and arranged on the surface of the insulation substrate, and a conductive pattern 12 and an interlayer connection element 13 arranged on the inside of the insulation substrate as a wiring element for electrically coupling between the internal pad 14a or the external pad 14 and a corresponding terminal of the electric element 15. Specifically, the driving circuit 10 is a multi-layer substrate, in which the conductive pattern 12 is arranged in the insulation substrate made of thermo-plastic resin in a multiple layer manner, parts of the conductive patterns in different layers are electrically coupled with each other via the interlayer connection element 13 (e.g., configured to be made of conductive paste) in an interlayer connection manner, and the electric element 15 arranged in the insulation substrate is electrically coupled with the conductive pattern 12 and the interlayer connection element 13. Further, the insulation substrate made of thermoplastic resin 11 has flexibility. Thus, the driving circuit 10 has the flexibility since the insulation substrate has flexibility. Specifically, the driving circuit 10 has bendability. Thus, the shape of the driving circuit 10 can be deformable comparatively freely.

Here, the structure and the arrangement position of the internal pad 14a is not limited to the above as long as the internal pad 14a is electrically connectable with the electric motor 20 via the wiring 1020. The driving circuit 10 is arranged in the cooling medium. Accordingly, the internal pad 14a, a connection portion between the internal pad 14a and the wiring 1020, a connection portion between the wiring 1020 and the electric motor 20 and the like may be sealed with a sealing member (e.g., adhesive material) if necessary. Specifically, for example, when the cooling medium having corrosion action with respect to metal or the cooling medium having conductivity is used as the cooling medium, reliability of the internal pad 14a, the connection portion between the internal pad 14a and the wiring 1020, and the connection portion between the wiring 1020 and the electric motor 20 are improved.

The conductive patter 12 as a part of a wiring is formed on the surface of the thermo-plastic resin 11. Further, the thermo-plastic resin 11 is formed such that a resin film (i.e., a base film) having thermo-plastic property and including the interlayer connection element 13 (i.e., a connection via) as a part of a wiring formed such that conductive material (e.g., conductive paste) is embedded in a via hole 13a having a bottom of the conductive patter 12, a resin film (i.e., a base film) having thermo-plastic property and including a through hole corresponding to dimensions of the electric element 15, and the like are stacked in multiple layer manner and bonded (i.e., welded) to each other. The number of resin films to be stacked is determined so as to have the flexibility in the driving circuit 10 appropriately.

The electric element 15 is bonded to multiple above-described resin films having thermo-plastic property. The electric element 15 is sealed in the thermoplastic resin 11. Thus, the electric element 15 embedded in the thermo-plastic resin 11 may be used even in case of a bare chip. The constitutional material of the resin film for providing the thermo-plastic resin 11 is configured to be, for example, polyether ether ketone (i.e., PEEK), polyether imide (i.e., PEI), a combination of polyether ether ketone and polyether imide, or liquid crystal polymer.

Figure 3:
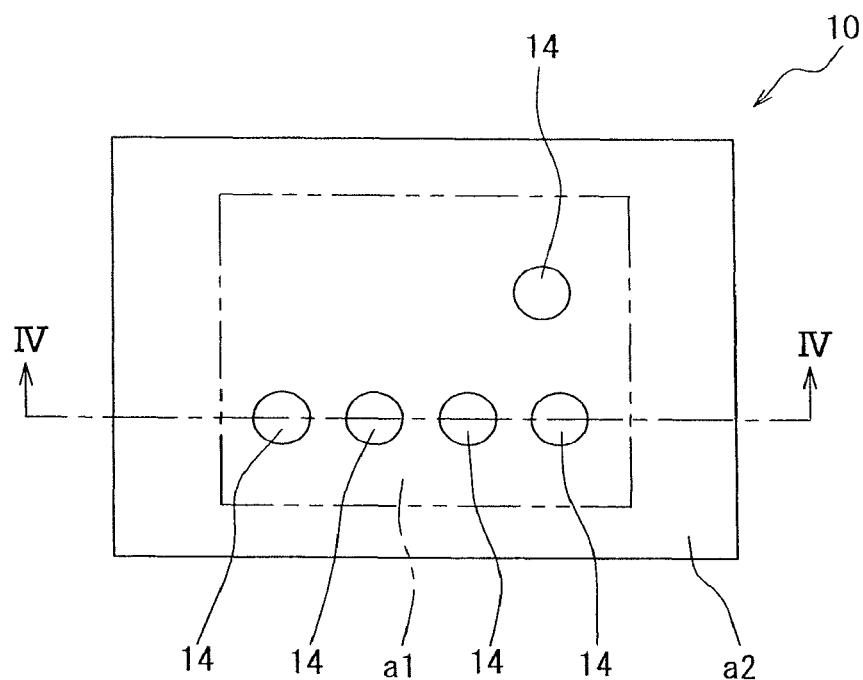
FIG. 3 is a cross sectional view showing a structure of a driving circuit 10 according to the first embodiment of the present invention.
Figure 4:
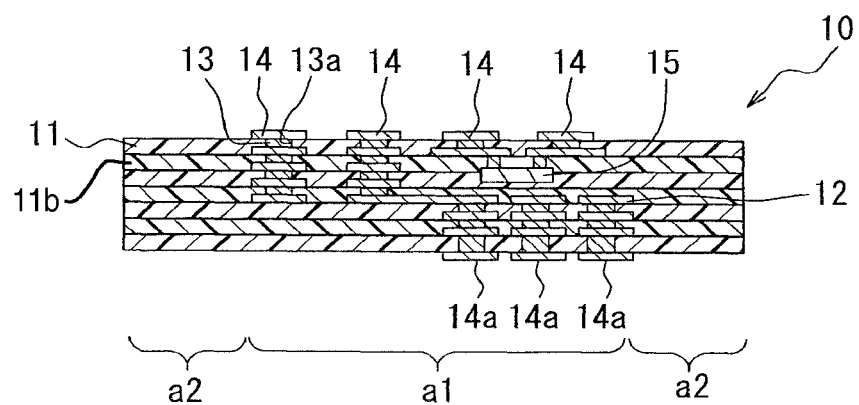
FIG. 4 is a cross sectional view of a line IV-IV in FIG. 3.

Further, as shown in FIG. 3, the external pad 14 is arranged on one surface (i.e., one surface of the insulation substrate) of the driving circuit 10 as a surface facing the first housing 41. The internal pad 14a is arranged on the other surface (i.e., the other surface of the insulation substrate, that is a back surface of a forming surface of the external pad 14) of the driving circuit 10.

Here, as shown in FIG. 3, the driving circuit 10 includes an electric element region a1, in which the embedded electric element 15 is arranged, and a periphery region a2, in which the electric element 15 is not arranged. The periphery region a2 and the electric element region a1 are disposed on a virtual plane in a thickness direction, and the periphery region a2 surrounds the electric element region a1. Here, it is not always necessary to divide the driving circuit 10 into the periphery region a2 and the electric element region a1.

The driving circuit 10 is manufactured as follows. Multiple above-described thermo-plastic resin films are stacked such that the electric element 15 is arranged on the inside of the films. Multiple thermoplastic resin films in a stacked manner are heated, and pressurized from both sides in the stacking direction. For example, the films are pressurized at atmospheric temperature in a range between 250° C. and 350° C. under pressure in a range between 1 MPa and 10 MPa for ten to twenty minutes. Thus, the films in block are bonded in a thermo-compression manner so that the driving circuit 10 is manufactured. The above manufacturing method is an example, and not limited to the above manufacturing method.

As shown in FIG. 3, the driving circuit 10 is disposed in the cooling medium passage c1, and is attached to the inner wall (having a curved surface) of the first housing 41 with adhesive, for example. When the driving circuit 10 is attached to the first housing 41, the driving circuit 10 and the first housing 41 are aligned and attached with each other so that the external pad 14 disposed on the surface of the driving circuit 10 coincides with the hole 411a for the terminal arranged in the first housing 41. Thus, the driving circuit 10 is attached to the first housing 41 such that the external pad 14 is positioned with the hole 411a.

Thus, the first housing 41 includes the hole 411a, which is arranged on the surface of the first housing 41 facing the driving circuit 10, so that the terminal 1000 for electrically coupling between the driving circuit 10 and the external circuit is arranged in the hole 411a and hermetically sealed with the sealing member 411. The driving circuit 10 is attached to the inner wall of the first housing 41 such that one surface of the circuit 10, on which the external pad 14 is formed, provides a facing surface to the inner wall, and the external pad 14 is aligned at the hole 411a. Thus, the cooling medium is restricted from leaking, and the driving circuit 10 is arranged in the housing (i.e., the first housing 41 and the second housing).

Further, the driving circuit 10 is preferably closely-attached to the inner wall of the first housing 41. In this case, even if the sealing member 411 is not arranged in the hole

411*a*, the cooling medium is restricted from leaking through the hole 411*a*, and the driving circuit 10 is arranged in the housing (i.e., the first housing 41 and the second housing). This point will be explained later.

Further, since the driving circuit 10 is made of thermoplastic resin 11, the driving circuit 10 may be attached to the first housing 41 by a thermal compression bonding method. In this case, the driving circuit 10 is easily closely-attached to the inner wall of the first housing 41. This point will be explained later. Thus, when the driving circuit 10 is attached to the first housing 41 by the thermal compression bonding method, a compression force with respect to the periphery region a2 is stronger than a compression force with respect to the electric element region a1. Thus, the bonding force between the driving circuit 10 and the first housing 41 is improved, and the stress with respect to the electric element 15 is reduced.

Here, when the driving circuit 10 is attached to the inner wall (having a curved surface) of the first housing 41 with adhesive, it is necessary to press the driving circuit 10 on the first housing 41. Thus, even when the driving circuit 10 is attached to the first housing 41 with adhesive, the compression force with respect to the periphery region a2 is set to be stronger than the compression force with respect to the electric element region a1, so that the bonding force between the driving circuit 10 and the first housing 41 is improved, and the stress with respect to the electric element 15 is reduced.

Thus, the shape of the driving circuit 10 can be comparatively freely deformable since the insulation substrate has flexibility. Further, since the electric element 15 embedded in the driving circuit 10 and the conductive pattern 12 and the interlayer connection element 13 as a wiring portion are arranged in the thermoplastic resin 11, they are sealed with the thermo-plastic resin 11. Thus, the driving circuit 10 disposed in the cooling medium passage has a shape along with the curved surface of the inner wall of the first housing 41, which is attached to the inner wall of the first housing 41 having the cylindrical shape.

Accordingly, in the electric compressor 100 according to the present embodiment, since the driving circuit 10 other than the attachment surface to the first housing 41 directly contacts the cooling medium, the cooling performance of the driving circuit 10 is improved without increasing the dimensions of the driving circuit 10.

Further, as described above, the concavity 24*a*1 is formed on the stator core 24*a*, and the driving circuit 10 is arranged in the cooling medium passage c1, which is formed between the concavity 24*a*1 and the inner wall of the first housing 41. Thus, it is not necessary to secure the mounting space of the driving circuit 10 on the outside of the first housing 41. Accordingly, the driving circuit 10 is mounted on the inside of the housing without increasing the dimensions of the electric compressor 100 itself.

Here, in the present embodiment, the insulation substrate of the driving circuit 10 is formed from multiple resin films having thermo-plastic property. The invention is not limited to this feature. The insulation substrate of the driving circuit in the present invention may include at least the thermoplastic resin. Alternatively, the insulation substrate may be formed from a substrate film, which includes the thermoplastic resin and functions as an adhesive layer, and a substrate film, which includes thermo-setting resin. The substrate films are alternately stacked and bonded to each other.

Thus, although the preferred embodiment of the present invention has been explained, the present invention is not limited to the above described embodiments. The present invention can be modified variously within a scope of the present invention.

Figure 5:
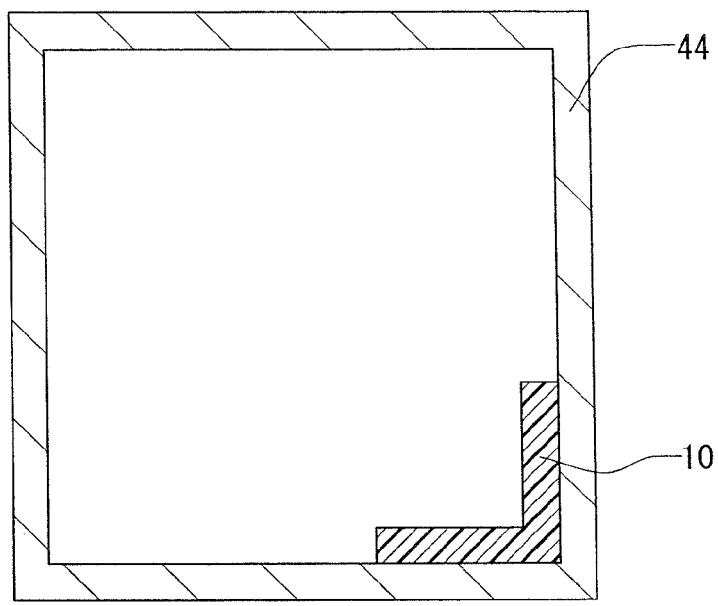
FIG. 5 is a cross sectional view showing an electric compressor according to a first modification.

For example, in the above embodiment, the driving circuit 10 is attached to the inner wall (i.e., the curved surface) of the first housing 41 having the cylindrical shape. The present invention is not limited to this. As other examples, a modification example No. 1 shown in FIG. 5 may be applied. Specifically, the driving circuit 10 may be attached to a corner of the first housing 44 having a hollow quadratic prism shape. Here, a cross section of the electric compressor shown in FIG. 5 corresponds to FIG. 2. Further, in FIG. 5, the electric motor 20 and the like are not shown for convenience.

In the driving circuit 10 in the present invention, as described above, since the insulation substrate has flexibility (i.e., bendability), the driving circuit 10 is comparatively freely deformable. Accordingly, the driving circuit 10 can be attached to the corner of the first housing 44 shown in FIG. 5.

Figure 6:
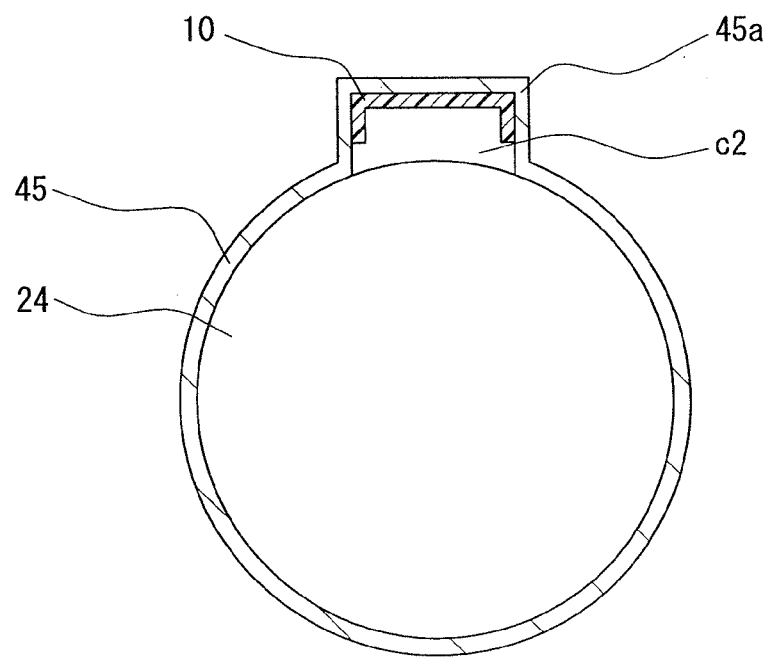
FIG. 6 is a cross sectional view showing an electric compressor according to a second modification.

In the above embodiment, the concavity 24*a*1 is formed on the stator core 24*a*. The present invention is not limited to this. Specifically, when the cooling medium passage is formed between the inner wall of the first housing 45 and the outer wall of the stator core 24*a* facing the inner wall, a concavity 45*a* (corresponding to the second concavity in the present invention) may be formed on the first housing 45, as described in a modification example No. 2 shown in FIG. 6. Specifically, the concavity 45*a* is formed on the inner wall of the first housing 41 such that the concavity 45*a* is concaved to the outside of the driving shaft 22 in the radial direction, and the concavity 45*a* extends to the axial direction of the driving shaft 22. Thus, the cooling medium passage c2 is formed between the second concavity 45*a* and the outer wall of the stator core 24*a*. Here, FIG. 6 is a drawing corresponding to FIG. 5 in the above embodiment. The cross sectional structure of the electric motor 20 is simplified and shown for convenience.

The driving circuit 10 is attached to the concavity 45*a*. However, as described above, the driving circuit 10 in the present invention can be comparatively freely deformable. Thus, the shape of the concavity 45*a* is not limited to a specific shape, so that the shape of the concavity 45*a* may be comparatively free. One example of the concavity 45*a* may have a cross section (i.e., a cross section taken along a virtual plane perpendicular to the driving shaft 22) of a C shape, as shown in FIG. 6.

Here, in the present embodiment, the cooling medium passages c1, c2 are formed between the stator core 24*a* and the inner wall of the first housing 41. The present invention is not limited to this.

An object of the present invention regarding the electric compressor in the present invention is achieved as long as the passages c1, c2 are formed between the suction port 41*a*1 and the compression mechanism unit 30 in the first housing 41.

Thus, the position, at which the driving circuit 10 is arranged in the present invention, is not limited between the stator core 24*a* and the inner wall of the first housing 41. The position is not limited specifically as long as the position is on the inner wall of the first housing 41 for providing the cooling medium passage. Specifically, when the driving circuit 10 is attached to a position, which is exposed to the cooling medium, and has a shape fitted to the shape of the inner wall of the housing (i.e., the first housing 41 and the second housing 42), the object of the present invention is achieved.

Thus, the present invention provides the electric compressor for improving the cooling performance of the circuit board without increasing the dimensions of the circuit board.

Thus, the electric compressor includes: the housing (i.e., the first housing 41 and the second housing 42) having the cooling medium suction port (i.e., the suction port 41a1) and the cooling medium discharge port (i.e., the discharge port 42a1); the electric motor 20 accommodated in the housing (i.e., the first housing 41 and the second housing 42); the driving circuit 10 accommodated in the housing (i.e., the first housing 41 and the second housing 42), and electrically coupled with the electric motor 20 and the external circuit disposed on the outside of the housing (i.e., the first housing 41 and the second housing 42) so that the driving circuit 10 drives the electric motor 20; the compression mechanism unit 30 accommodated in the housing (i.e., the first housing 41 and the second housing 42, driven by the rotation driving force of the electric motor 20 so that the unit 30 sucks the cooling medium from the cooling medium suction port (i.e., the suction port 41a1), compresses the cooling medium, and discharges the cooling medium through the cooling medium discharge port (i.e., the discharge port 42a1); and the cooling medium passage (i.e., the cooling medium passage c1 and the cooling medium passage c2) arranged in the housing (i.e., the first housing 41 and the second housing 42) between the cooling medium suction port (i.e., the suction port 41a1) and the compression mechanism unit 30 and flowing the cooling medium therethrough, characterized in that the driving circuit 10 includes: the electric element 15 arranged on the inside of the insulation substrate having of at least the thermoplastic resin 11; the electrode for internal connection (i.e., the internal pad 14a) formed on the surface of the insulation substrate and electrically coupled with the electric motor 20; the electrode for external connection (i.e., the external pad 14) formed on the surface of the insulation substrate and electrically coupled with the external circuit; and the wiring portion (i.e., the conductive pattern 12 and the interlayer connection element 13) arranged on the inside of the insulation substrate and electrically coupled with terminals of the electric element 15 corresponding to the electrode for internal connection (i.e., the internal pad 14a) and the electrode for external connection (i.e., the external pad 14), the insulation substrate of the driving circuit 10 has flexibility so that the driving circuit 10 is attached on the inner wall of the housing (i.e., the first housing 411 and the second housing 42), which provides the cooling medium passage (i.e., the cooling medium passage c1 and the cooling medium passage c2), to fit the shape of the inner wall of the housing (i.e., the first housing 411 and the second housing 42).

Thus, since the insulation substrate of the driving circuit 10 has the flexibility, the shape of the driving circuit 10 is comparatively freely deformable. Further, since the electric element 15 of the driving circuit 10 and the wiring portion (i.e., the conductive pattern 12 and the interlayer connection element 13) are arranged in the insulation substrate, they are sealed in the insulation substrate. Thus, the driving circuit 10 electrically coupled with the external circuit and the electric motor 20 is disposed in the cooling medium, and further, attached to fit the shape of the inner wall of the housing.

Accordingly, since, in the electric compressor 100, the driving circuit 10 other than the attachment surface to the housing (i.e., the first housing 41 and the second housing 42) directly contacts the cooling medium, the cooling performance of the driving circuit 10 is improved without increasing the dimensions of the driving circuit 10.

Further, the insulation substrate may be formed such that multiple substrate films including the thermo-plastic resin 11 are stacked and bonded to each other. In this case, multiple substrate films are stacked under a condition that the electric element 15 and the wiring portion (i.e., the conductive pattern 12 and the interlayer connection element 13) are arranged on the inside, and they are heated and pressurized along with the stacking direction of the substrate films, so that the driving circuit is formed.

Alternatively, the insulation substrate may be formed such that the substrate films functioning as the adhesive and including the thermo-plastic (thermoplastic) resin 11 and the substrate films including the thermo-setting (thermosetting) resin 11b are stacked alternately and bonded to each other.

Alternatively, the substrate film may include a connection via (i.e., the interlayer connection element 13) as the wiring portion provided by the conductive member in the via hole (i.e., the via hole 13a).

Alternatively, the housing (i.e., the first housing 41 and the second housing 42) may include the hole (i.e., the hole 411a) on the surface facing the driving circuit 10, and the connection member (i.e., the terminal 1000) for electrically coupling between the driving circuit 10 and the external circuit is hermetically arranged in the hole. The driving circuit 10 may be attached to the inner wall of the housing (i.e., the first housing 41 and the second housing 42) such that the one surface of the circuit 10, on which the electrode for external connection (i.e., the external pad 14) is formed, provides the facing surface, and the electrode for external connection (i.e., the external pad 14) is positioned at the hole (i.e., the hole 411a). In this case, the driving circuit 10 is arranged in the housing (i.e., the first housing 41 and the second housing 42) with restricting the leak of the cooling medium.

The electric motor may include: the driving shaft 22 supported rotatably in the housing (i.e., the first housing 41 and the second housing 42) for transmitting the rotation driving force to the compression mechanism unit 30; the stator 24 including the stator core 24a arranged on the outside of the driving shaft 22 in the radial direction and the stator coil 24a winded around the stator core 24a, and generating the rotation magnetic field by the driving current from the driving circuit 10; and the rotor 23 arranged on the center side of the driving shaft 22 in the radiation direction with respect to the stator core 24a, and rotating the driving shaft 22 according to the rotation magnetic field generated by the stator 24, wherein the cooling medium passage (i.e., the cooling medium passage c1 and the cooling medium passage c2) is disposed between the inner wall of the housing (i.e., the first housing 41 and the second housing 42) and the outer wall of the stator core 24a facing the inner wall of the housing (i.e., the first housing 41 and the second housing 42), and extends in the axial direction of the driving shaft 22. Thus, it is preferable because both of the driving circuit 10 and the electric motor 20 are cooled.

Further, when the cooling medium passage is arranged between the inner wall of the housing (i.e., the first housing 41 and the second housing 42) and the outer wall of the stator core 24a facing the inner wall of the housing (i.e., the first housing 41 and the second housing 42), the first concavity 24a1 may be formed on the outer wall of the stator core 24a, and extend in the axial direction of the driving shaft 22, and the cooling medium passage (i.e., the cooling medium passage c1) may be formed between the inner wall of the housing (i.e., the first housing 41 and the second housing 42) and the first concavity 24a1. In this case, the driving circuit 10 can be mounted on the inside of the housing (i.e., the first housing 41 and the second housing 42) without increasing the dimensions of the electric compressor 100.

Further, when the cooling medium passage (i.e., the cooling medium passage c2) is arranged between the inner wall of the housing (i.e., the first housing 41 and the second housing 42) and the outer wall of the stator core 24a facing the inner wall of the housing (i.e., the first housing 41 and the second housing 42), the second concavity 45a may be formed on the inner wall of the housing (i.e., the first housing 41 and the second housing 42), be concaved to the outside of the driving shaft 22 in the radial direction, and extend in the axial direction of the driving shaft 22, and the cooling medium passage (i.e., the cooling medium passage c2) may be formed between the second concavity 45a and the outer wall of the stator core 24a.

Here, the driving circuit 10 is attached to the second concavity 45a. However, as described above, the driving circuit 10 according to the present invention is comparatively freely deformable. Thus, the shape of the second concavity 45a is not limited to specifically, but comparatively freely determined.

Alternatively, the driving circuit 10 may include the electric element region a1 and the periphery region a2 on the virtual plane in the thickness direction. The electric element 15 is arranged on the electric element region a1, and the periphery region a2 surrounds the electric element region a1, and no electric element 15 is arranged on the periphery region a2. Thus, when the driving circuit 10 is attached to the housing (i.e., the first housing 41 and the second housing 42) by the thermal compression bonding method, the compression force with respect to the periphery region a2 is stronger than the compression force with respect to the electric element region a1, so that the bonding force between the driving circuit 10 and the housing (i.e., first housing 41 and the second housing 42) is improved, and the stress with respect to the electric element 15 is reduced.

Second Embodiment

As described above, in order to restrict the leak of the cooling medium through the hole 411a, the driving circuit 10 is hermetically attached to the inner wall of the first housing 41, so that the terminal 1000 and the connection portion between the terminal 100 and the external pad 14 is separated from the cooling medium. Specifically, the terminal 1000 and the connection portion between the terminal 100 and the external pad 14 are hermetically sealed.

In the above embodiment and modifications, the attachment structure of the circuit board is applied for the electric compressor. However, the electric device according to the present invention is not limited to the above features. Specifically, the electric device according to the present invention may be applied for equipment such as a fuel pump, a water pump and oil pump other in addition to the electric compressor. Even when the circuit board in the electric device according to the present embodiment is not attached to fit the shape of the inner wall of the housing, the object can be achieved.

Figure 7:
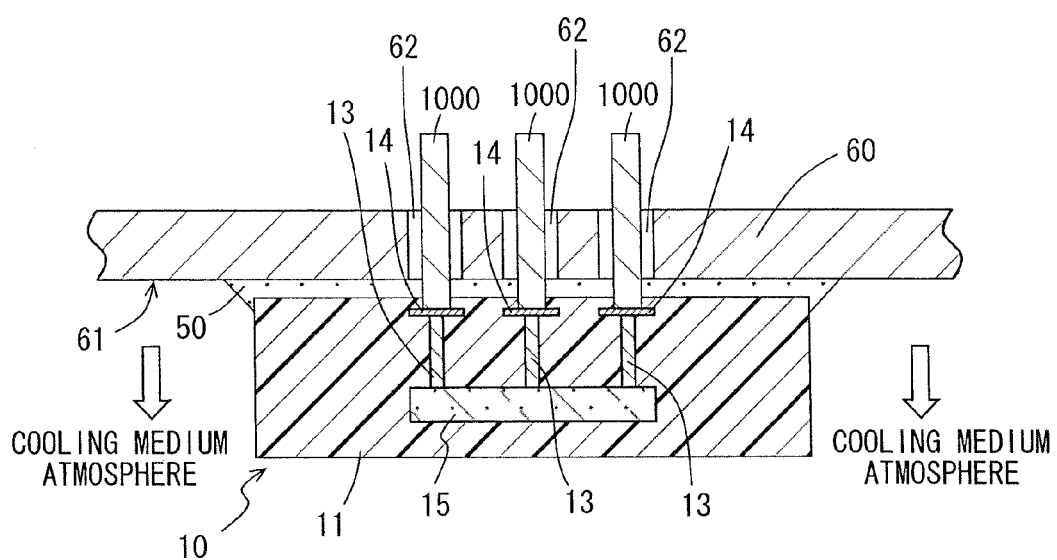
FIG. 7 is a cross sectional view showing an attachment structure of a circuit board according to a second embodiment of the present invention.

The electric device according to the second embodiment includes the circuit board 10, the terminal 1000 (i.e., the electrode for external connection) and the adhesive 50 as the separation member, as shown in FIG. 7. The circuit board 10 is arranged in the cooling medium of the housing, and the electric element 15 is sealed and mounted in the board 10. Further, the external pad 14 (i.e., the electrode for external connection) electrically coupled with the electric element 15 is formed on the board 10. The terminal 1000 is electrically coupled with the external pad 14 of the circuit board 10. The adhesive 50 (e.g., epoxy series adhesive) separates the connection portion between the external pad 14 and the terminal 1000 and the terminal 1000 from the cooling medium. The structure and the manufacturing method of the circuit board 10 is substantially the same as the driving circuit 10 described above. Accordingly, the circuit board according to the present embodiment has the same reference numeral as the driving circuit described above.

The circuit board 10 includes: the electric element 15 arranged (i.e., sealed) on the inside of the insulation substrate made of thermo-plastic resin 11; the external pad 14 (i.e., the electrode for external connection) electrically coupled with the terminal 1000 and formed in the insulation substrate; and the conductive pattern (not shown, but similar to the above embodiment) and the interlayer connection element 13 as the wiring portion disposed on the inside of the insulation substrate for electrically coupling between the external pad 14 and the corresponding terminal of the electric element 15. Specifically, the board 10 includes the conductive pattern and the interlayer connection element 13 as the wiring portion. Further, as shown in FIG. 7, the external pad 14 is formed on one surface side (i.e., one surface side of the insulation substrate) of the circuit board 10, which is the surface side facing the inner wall 61 of the housing 60.

The insulation substrate made of the thermo-plastic resin 11 may have bendability. Alternatively, the substrate may not have bendability. Specifically, the circuit board 10 may have flexibility. Alternatively, the circuit board 10 may not have flexibility. When the circuit board 10 has the flexibility, the shape can be comparatively freely deformable. Here, when the insulation substrate has the bendability, the circuit board 10 has the bendability.

The thermo-plastic resin 11 is formed such that the resin films (i.e., the substrate film) made of thermo-plastic resin, the surface of which the conductive pattern as a part of the wiring portion is formed on, and including the interlayer connection element 13 (i.e., the connection via) as a part of the wiring portion, which is provided such that the conductive member (e.g., the conductive paste) is embedded in the via hole 13a having the bottom of the conductive pattern, and the resin films (i.e., the substrate film) made of thermo-plastic resin having the through hole corresponding to the dimensions of the electric element 15 are stacked and bonded (welded) to each other. Further, the thermo-plastic resin 11 disposed in a surface portion or the thermo-plastic resin 11 disposed on a few layers from the surface portion includes a hole disposed at a position corresponding to the electrode of the electric element 15, and the hole corresponds to the dimensions of the part of the terminal 1000, which is arranged in the insulation substrate. Here, in order to provide the bendability of the circuit board 10, the number of resin films to be stacked is appropriately determined to have the flexibility.

On other words, the circuit board 10 is a multi-layer board in such a manner that the conductive patter is arranged in a multi-layered manner in the insulation substrate made of thermo-plastic resin 11, parts of the conductive patterns disposed in different layers are electrically coupled with each other via the interlayer connection element 13 (e.g., configured to be made of conductive paste) in an interlayer connection manner, and the electric element 15 arranged in the insulation substrate is electrically coupled with the conductive pattern (i.e., the wiring portion) and the interlayer connection element 13 (i.e., the wiring portion).

The electric element 15 is formed to bond with the above described multiple resin films made of thermo-plastic resin. The electric element 15 is sealed with the thermo-plastic resin 11. Thus, even when the electric element 15 embedded in the thermo-plastic resin 11 is a bare chip, it is used for. Further, a part of the terminal 1000 is embedded in the thermo-plastic resin 11.

Here, the construction material of the resin films for providing the thermo-plastic resin 11 is, for example, polyether ether ketone (i.e., PEEK), polyether imide (i.e., PEI), a combination of polyether ether ketone and polyether imide, or liquid crystal polymer.

The circuit board 10 is manufactured as follows. The above described multiple thermoplastic resin films are stacked such that the electric element 15 is arranged on the inside of the films, a part of the terminal 1000 is arranged on the inside of the films, and the external pad 14 is positioned. Under this condition, the multiple thermo-plastic resin films are heated and pressurized from both sides thereof in the stacking direction. For example, the films are pressurized under pressure in a range between 1 MPa and 10 MPa for ten to twenty minutes at atmospheric temperature in a range between 250° C. and 350° C. Thus, the films are thermally compressed and bonded in block so that the circuit board 10 is manufactured. Here, this manufacturing method is merely an example, and is not limited to this.

Thus, in the circuit board 10, the electric element 15, the conductive pattern and the interlayer connection element 13 are sealed with the thermo-plastic resin 11. Thus, the electric element 15, the conductive pattern and the interlayer connection element 13 are easily sealed. When the thermo-plastic resin 11 is heated, the resin 11 melts. When the heating temperature is reduced, the melted resin 11 is solidified. Accordingly, when the thermo-plastic resin is heated and pressurized, the electric element 15, the conductive pattern and the interlayer connection element 13 are easily sealed.

Here, the structure of the terminal 1000 is similar to the above terminal. Accordingly, the terminal 1000 according to the present embodiment has the same reference numeral as the above terminal 1000, and the detailed explanation is omitted.

The reference numeral 60 in FIG. 7 represents the housing for surrounding the cooling medium. Specifically, the cooling medium is arranged (i.e., filled) in the housing 60. Thus, the cooling medium atmosphere is disposed on the inside of the housing 60. Here, for example, the suction port (i.e., the cooling medium suction port) for sucking the cooling medium into the housing 60 and the discharge port (i.e., the cooling medium discharge port) for discharging the cooling medium to the outside of the housing 60 may be formed in the housing 60, similar to the above embodiment. The cooling medium may be HFC series coolant, HC series coolant, HFO coolant or the like. Further, the cooling medium may be coolant having corrosion action with respect to metal or coolant having conductivity (such as ion solution or cooling water).

A through hole 62 for penetrating the terminal 1000 (i.e., the terminal for external connection) therethrough is formed at a portion of the housing 60, to which the circuit board 10 is attached. The terminal 1000 is made of metal, and electrically couples between the circuit board 10 and the external circuit. Thus, the through hole 62 penetrating the wall is formed on the wall of the housing 60. In the above described embodiment, the sealing member 411 having insulation property is formed in the through hole 62. However, in the present embodiment, since the through hole 62 is sealed with the adhesive 50, the sealing member 411 is not necessary. Specifically, the housing 60 is sealed with the adhesive 50 so that the air-tightness of the space on the inside of the housing 60 is maintained.

As shown in FIG. 7, the circuit board 10 is attached to the inner wall 61 of the housing 60 with the adhesive 50 as the separation member. Specifically, the circuit board 10 is attached to the inner wall 61 of the housing 60 via the adhesive 50 under a condition that a part of the terminal 1000 is disposed on the outside of the housing 60 through the through hole 62, which penetrates the wall of the housing 60. Thus, the circuit board 10 is disposed in the cooling medium of the housing 60. When the circuit board 10 is attached to the housing 60, the circuit board 10 and the housing 60 are positioned and attached to each other so as to align the terminal 1000 connected to the external pad 14 of the circuit board 10 to the through hole 62 for the terminal formed in the housing 60.

The adhesive 50 is arranged on the surface of the circuit board 10 facing the inner wall 61 such that the adhesive 50 surrounds the terminal 1000 and the connection portion between the terminal 1000 and the external pad 14, and surrounds a position of the board 10 facing the through hole 62. Thus, the adhesive 50 is arranged between the circuit board 10 and the inner wall of the housing 61 at a position facing the terminal 1000, the connection portion between the terminal 1000 and the external pod 14 and the through hole 62.

Here, as described above, the connection portion between the terminal 1000 and the external pad 14 is isolated from the cooling medium by the insulation substrate (i.e., the thermoplastic resin 11) of the circuit board 10. Thus, in other words, the adhesive 50 is arranged on the surface of the circuit board 10 facing the inner wall 61 such that the adhesive 50 surrounds the terminal 1000, and surrounds the position facing the through hole 62. Specifically, in other words, the adhesive is arranged around the position facing the terminal 1000 and the through hole 62 between the circuit board 10 and the inner wall 61.

Thus, the inner wall 61 of the housing 60 and the surface of the circuit board 10 facing the inner wall 61 are bonded to each other with the adhesive 50 so that the terminal 1000 is isolated from the cooling medium. Specifically, the terminal 1000 is separated from the cooling medium with the adhesive 50. Here, the connection portion between the terminal 1000 and the external pad 14 is sealed with the insulation substrate (i.e., the thermoplastic resin 11) of the circuit board 10. Thus, the insulation substrate (i.e., the thermo-plastic resin 11) of the circuit board 10 also functions as the separation member.

Thus, the circuit board 10 is arranged in the cooling medium, so that the board 10 directly contacts the cooling medium. Thus, the cooling performance of the circuit board 10 is improved.

Further, since the device includes the separation member such as the adhesive 50 for separating the terminal 1000 and the connection portion between the terminal 1000 and the external pad 14 from the cooling medium, the terminal 1000 and the connection portion between the terminal 1000 and the external pad 14 are prevented from contacting the cooling medium. Thus, even when the cooling medium having corrosion action with respect to metal is used, the terminal 1000 and the connection portion between the terminal 1000 and the external pad 14 is prevented from corroding. Further, even when the cooling medium having conductivity is used, the terminal 1000 and the connection portion between the terminal 1000 and the external pad 14 is prevented from conducting with the cooling medium. Accordingly, the cooling performance of the circuit board 10 is improved, and the reliability of the terminal 1000 and the connection portion between the terminal 1000 and the external pad 14 is also improved. Here, since the electric element 15 is mounted on the circuit board 10 under a condition that the element 15 is sealed, the reliability is not reduced by the cooling medium even when the cooling medium having corrosion action with respect to metal or the cooling medium having conductivity is used. In other words, in the electric device according to the second embodiment, not only the nonconductive cooling medium but also the conductive cooling medium or the cooling medium having corrosion action with respect to metal can be used. Thus, the degree of freedom for selecting the cooling medium is improved.

Further, in the above case, the circuit board 10 is attached to the housing 60, and the terminal 1000 and the connection portion between the terminal 1000 and the external pad 14 are separated from the cooling medium. Further, a part of the terminal 1000 is arranged on the outside of the housing 60, and the cooling medium is prevented from leaking from the through hole 62, in which the terminal 1000 formed in the housing 60 is inserted.

Here, the external pad 14 is formed in the insulation substrate. The present invention is not limited to this. For example, the external pad 14 may be formed on the surface (i.e., the surface facing the inner wall 61) of the insulation substrate. Thus, since the terminal 1000 and the connection portion between the terminal 1000 and the external pad 14 are separated from the cooling medium with the adhesive as the separation member, the reliability is not reduced by the cooling medium.

Although not shown in the drawings, the internal pad (i.e., the electrode for internal connection) for electrically coupling with a device in the housing 60 may be formed on the surface (i.e., same as the surface of the external pad 14) of the insulation substrate. Alternatively, the internal pad may be formed in the insulation substrate (i.e., the thermo-plastic resin 11). The terminal connecting to the internal pad is formed to protrude from the insulation substrate toward the same direction as the terminal 1000 connected to the external pad 14. In this case, the circuit board 10 and a device in the housing 60 are electrically coupled with each other at a portion outside of the housing 60 (i.e., outside of the cooling medium atmosphere). Thus, the connection portion between the circuit board 10 and the device in the housing 60 is restricted from exposing in the cooling medium.

Specifically, the terminal on the element side (i.e., the wiring portion for the element) electrically connected to the element in the housing 60 is held in the through hole and hermetically sealed with the sealing member under a condition that the terminal penetrates the through hole formed on the wall of the housing 60. Thus, a part of the terminal on the element side is arranged on the outside of the housing 60. Specifically, the terminal on the element side is held in the through hole formed on the wall of the housing 60 and hermitically sealed, and at least a part of the terminal is arranged on the outside of the housing 60.

On the other hand, similar to the external pad 14, the internal pad on the circuit board 10 is electrically coupled with the terminal, a part of which is arranged on the outside of the housing 60. The terminal connected to the internal pad and the connection portion between the terminal and the internal pad are separated from the cooling medium with the adhesive 50, similar to the terminal 1000 and the connection portion between the terminal 1000 and the external pad 14. The terminal on the element side (i.e., the wiring portion for the element side) and the terminal connected to the internal pad are electrically coupled with each other at an outside of the housing 60. Here, when the internal pad is disposed in the insulation substrate (i.e., the thermo-plastic resin 11), the connection portion between the terminal and the internal pad is separated from the cooling medium with the thermo-plastic resin 11.

Thus, it is preferred that the circuit board 10 includes an electrode (i.e., the external pad 14 and the internal pad) only on the surface facing the inner wall 61 of the housing 60. Specifically, it is preferred that, in the circuit board 10, a metal member (i.e., the external pad 14 and the internal pad as the electrode) exposed on the outside of the insulation substrate (i.e., the thermo-plastic resin 11) is formed only on the surface of the circuit board 10 facing the inner wall 61 of the housing 60. Thus, it is preferable since the terminal 1000 and the connection portion between the terminal 1000 and the electrode (i.e., the external pad 14 and the internal pad) are easily separated from the cooling medium.

Here, the insulation substrate is formed such that substrate films including the thermo-plastic resin 11 and functioning as the adhesive layer and substrate films including the thermo-setting rein are alternatively stacked and bonded to each other.

The circuit board 10 provided by the insulation substrate having bendability is attached to the inner wall of the housing 60 to fit a shape of the inner wall of the housing 60. Thus, the circuit board 10 is attached to the inner wall 61 of the housing 60 without depending on the shape of the housing 60. Accordingly, the circuit board 10 is arranged in the housing 60 (i.e., in the cooling medium) without increasing the dimensions of the housing 60.

Third Modification

In the above embodiment, the terminal 1000 and the connection portion between the terminal 1000 and the external pad 14 are separated from the cooling medium with using the adhesive 50 and the insulation substrate (i.e., the thermo-plastic resin 11) of the circuit board 10. The present invention is not limited to this feature. As described in the third modification in FIG. 8A, the terminal 1000 and the connection portion between the terminal 1000 and the external pad 14 may be separated from the cooling medium with using a O-ring 80 and a screw 70. The above described second embodiment and the third modification have the same description largely, and therefore, the same description is not explained again, but the different features will be mainly explained.

The circuit board 10 is the same as the second embodiment basically. However, an electrode (i.e., the external pad 14 in the present modification) is formed only on the surface of the circuit board 10 facing the inner wall 61 of the housing 60. Specifically, in the circuit board 10, the metal portion (i.e., the external pad 14 as the electrode in the present modification) exposed to the outside of the insulation substrate (i.e., the thermo-plastic resin 11) is formed on the surface of the board 10 facing the inner wall 61 of the housing 60.

Further, in the circuit board 10 according to the present modification, the external pad 14 is formed on the surface of the insulation substrate (i.e., the thermo-plastic resin 11). Further, the through hole 11a penetrating the insulation substrate (i.e., the thermo-plastic resin 11) is formed at a part (i.e., at four corners in the present modification) of the circuit board 10. Here, the external pad 14 and the terminal 1000 are electrically coupled with each other after the circuit board 10 is manufactured by the heating and pressurizing method.

Figure 8A:
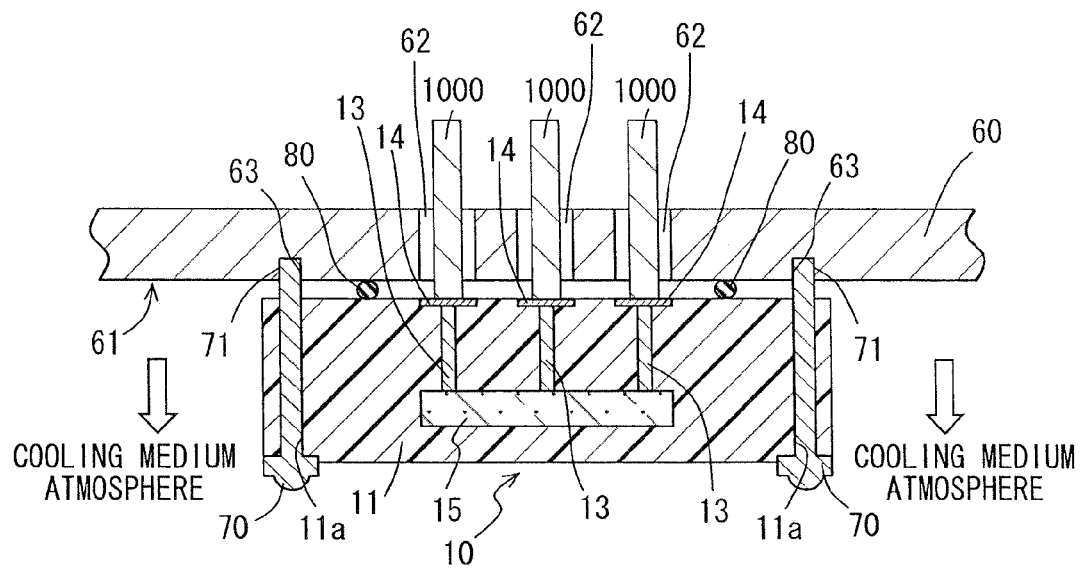
FIGS. 8A and 8B are views showing an attachment structure of a circuit board according to a third modification.

Further, the housing 60 is basically the same as the second embodiment. However, a female screw 63 corresponding to a male screw 71 of the screw 70 is formed in the housing according to the present modification, as shown in FIG. 8A. The female screw portion 63 in the housing 60 is disposed at a position facing the through hole 11a of the circuit board 10, which is to be attached to the housing 60. FIG. 8A is a cross sectional view of a structure such that the circuit board 10 is attached to the housing 60, and corresponds to FIG. 7 in the second embodiment.

Figure 8B:
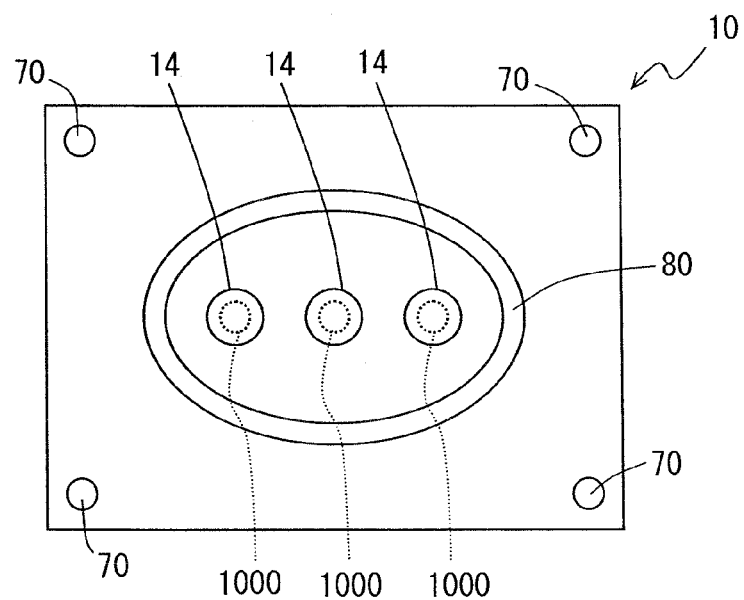

The O-ring 80 corresponds to the separation member (i.e., a ring shaped elastic member) in the present invention. As shown in FIG. 8B, the O-ring 80 surrounds the terminal 1000 and the connection portion between the terminal 1000 and the external pad 14 on the surface of the circuit board 10 facing the inner wall 61. Further, the O-ring 80 is arranged to surround the position facing the through hole 62. FIG. 8B is a plan view showing the circuit board 10 on the external pad 14 side under a condition that the O-ring 80 is arranged on the circuit board 10, and the screw 70 is inserted into the through hole 11a.

Here, in the present modification, the O-ring 80 is used for the ring-shaped elastic member. The present invention is not limited to this. The elastic member may be used as long as the elastic member surrounds the terminal 1000 and the connection portion between the terminal 1000 and the external pad 14, and further, surrounds the position facing the through hole 62, and adheres tightly to the circuit board 10 and the inner wall 61 of the housing 60.

Further, in the present modification, one O-ring 80 is used for surrounding multiple terminals 1000, multiple connection portions, and multiple positions facing multiple through holes 62 all at once. The present invention is not limited to this feature. For example, the O-ring 80 may be used for surrounding one terminal 1000, the connection portion between the one terminal 1000 and the external pad 14, and the position facing the through hole in which the one terminal is arranged. Specifically, as shown in FIG. 8A, when the device includes three terminals 1000, three O-rings 80 may be used. More specifically, one O-ring 80 may be arranged around each terminal 1000 (i.e., one terminal 1000, the connection portion between the one terminal 1000 and the external pad 14, and the position facing the through hole 62, in which the one terminal is arranged).

Further, the screw 70 corresponds to the separation member (i.e., a pressurizing member). As shown in FIG. 8A, the screw 70 pressurizes the circuit board 10 to the inner wall 61 side so that the circuit board 10 is attached to the housing 60. The screw 70 includes the male screw 71 corresponding to the female screw 63 at least at a part of the top end thereof. Here, in the present modification, the screw 70 is used for the pressurizing member. The present invention is not limited to this feature. The pressurizing member may be used as long as the pressurizing member pressurizes the circuit board 10 to the inner wall 61 side so that the circuit board 10 is attached to the housing 60.

The circuit board 10 is attached to the inner wall 61 of the housing 60 with the screw 70 via the O-ring 80 under a condition that a part of the terminal 1000 is arranged on the outside of the housing 60 from the through hole 62. The circuit board 10 is pressed to the inner wall 61 of the housing 60 by screwing with the male screw 71 with respect to the female screw 63. Thus, the O-ring 80 is attached tightly to the inner wall 61 of the housing 60 and the surface of the circuit board 10 facing the inner wall 61. In the third modification, the terminal 1000 and the connection portion between the terminal 1000 and the external pad 14 are separated from the cooling medium with using the screw 70 and the O-ring 80.

Thus, the circuit board 10 is attached to the housing 60, and the terminal 1000 and the connection portion between the terminal 1000 and the external pad 14 are separated from the cooling medium. Further, a part of the terminal 1000 is arranged on the outside of the housing 60, and the cooling medium is prevented from leaking through the through hole 62 formed on the housing 60.

Here, in the present modification, similar to the above embodiment, a structure may be used such that the terminal 1000 is sealed by the insulation substrate (i.e., the thermo-plastic resin 11) of the circuit board 10.

Fourth Modification

In the above embodiment, the terminal 1000 and the connection portion between the terminal 1000 and the external pad 14 are separated from the cooling medium with using the adhesive 50 and the insulation substrate (i.e., the thermo-plastic resin 11) of the circuit board 10. The present invention is not limited to this feature. As described in the fourth modification in FIG. 9A, the terminal 1000 and the connection portion between the terminal 1000 and the external pad 14 may be separated from the cooling medium with using a base 90 and an adhesive 51. The circuit board 10 according to the fourth modification is attached to the housing 60 under a condition that the board 10 is amounted on a mounting surface 92b of the base 90. The above described second embodiment and the fourth modification have the same description largely. Therefore, the same description is not explained, and the different features will be explained mainly.

Figure 9A:
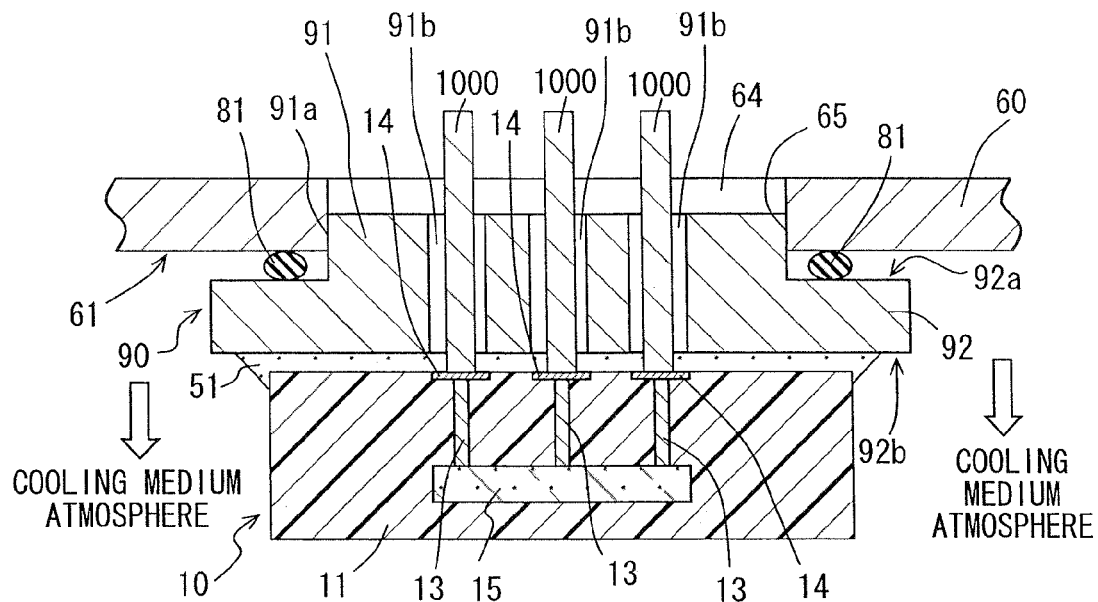
FIGS. 9A and 9B are views showing an attachment structure of a circuit board according to a third modification.

The circuit board 10 is basically the same as the second embodiment. However, as shown in FIG. 9A, in the circuit board 10 according to the present modification, the external pad 14 is formed on the surface of the insulation substrate (i.e., the thermo-plastic resin 11). Specifically, the metal portion (i.e., the external pad 14 as the electrode in the present modification) exposed to the outside of the insulation substrate (i.e., the thermo-plastic resin 11) is formed only on the surface of the circuit board 10 facing the mounting surface 92b of the base 90. Here, the external pad 14 and the terminal 1000 are electrically coupled with each other after the circuit board 10 is manufactured by the heating and pressurizing method.

The housing 60 is basically the same as the second embodiment. However, in the housing 60 according to the present modification, as shown in FIG. 9A, the through hole 64 (i.e., the first through hole), in which a part of the base 90 is inserted, is formed, and further, the female screw portion 65 corresponding to the male screw 91a of the base 90 is formed on the side wall of the housing 60 along with the through hole 64. FIG. 9A is a cross sectional view of a structure such that the circuit board 10 is attached to the housing 60, and corresponds to FIG. 7 of the second embodiment.

The base 90 corresponds to the separation member in the present invention. The base 90 includes an attachment portion 91 to be attached to the housing 60 and a mounting portion 92 on which the circuit board 10 is mounted. The attachment portion 91 and the mounting portion 92 have a columnar shape, and are integrally formed. The attachment portion 91 and the mounting portion 92 are arranged such that the center axis of the attachment portion 91 and the center axis of the mounting portion 92 are arranged on the same straight line.

Figure 9B:
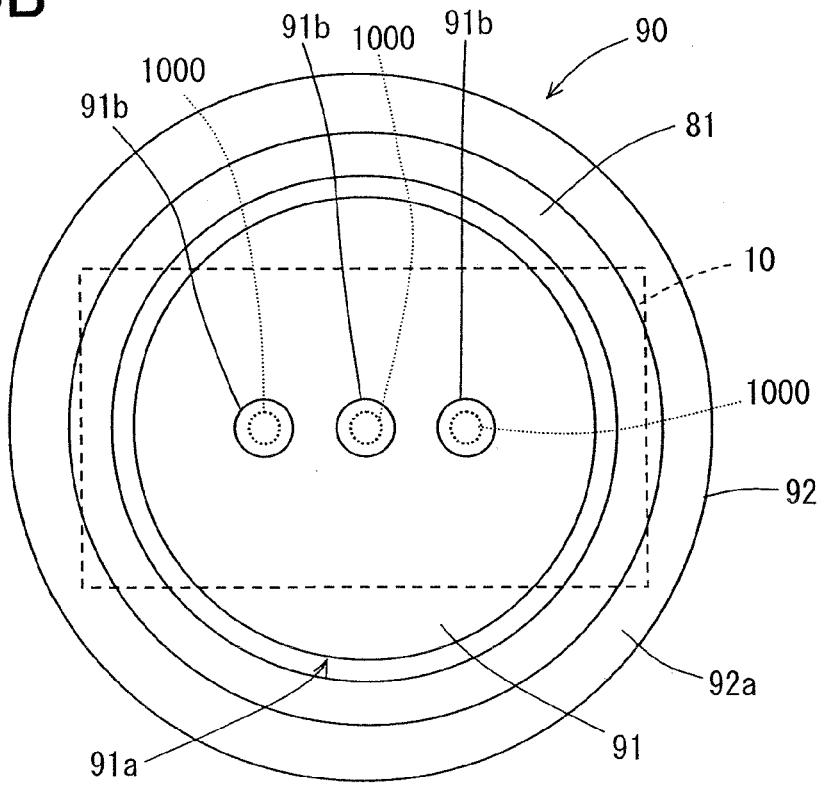

The male screw portion 91a corresponding to the female screw portion 65 of the housing 60 is formed on the attachment portion 91 around the outer periphery of the attachment portion 91 (i.e., the wall portion thereof). The attachment portion 91 is arranged on one surface of the mounting portion 92. The mounting portion 92 has the diameter longer than the attachment portion 91. The mounting portion 92 includes a contact surface 92a disposed on a side on which the attachment portion 91 is formed. The contact surface 92a fasces the inner wall 61 of the housing 60, and contacts the O-ring 81. The mounting portion 92 includes the mounting surface 92b, on which the circuit board 10 is mounted, opposite to the contact surface 92a. For example, the contact surface 92a and the mounting surface 92b are flat. Further, the terminal 1000 is arranged in the base 90 (i.e., the attachment portion 91 and the mounting portion 92) under a condition that the circuit board 10 is attached to the mounting surface 92b. The through holes 91b (i.e., the second through hole) penetrating the base 90 in the center axial direction is formed in the base 90. FIG. 9B is a plan view showing the base 90 before the base 90 is attached to the housing 60. Specifically, FIG. 9B is a plan view viewing the base 90 from the outside of the housing 60.

As shown in FIG. 9A, the base 90 is attached to the wall of the housing 60 via the O-ring 81, which is arranged at a position surrounding the attachment portion 91. Thus, the base 90 seals the through hole 64, which penetrates the wall of the housing 60, and is attached to the wall of the housing 60. Specifically, the base 90 is attached to the inner wall 61 side of the housing 60 by screwing with the male screw portion 91a with respect to the female screw portion 65. Further, the O-ring 81 arranged between the inner wall 61 of the housing 60 and the contact surface 92a of the base 90 is attached tightly to the inner wall 61 of the housing 60 and the contact surface 92a of the base 90, which faces the inner wall 61.

The circuit board 10 is bonded to the mounting surface 92b of the base 90, which is attached to the housing 60, with the adhesive 51 as the separation member. Specifically, the circuit board 10 is attached to the mounting surface 92b of the base 90 via the adhesive 51 under a condition that a part of the terminal 1000 is arranged on the outside of the housing 60 from the through hole 64 of the housing 60 and the through hole 91b of the base 90. Thus, the circuit board 10 is arranged in the cooling medium in the housing 60. Here, when the circuit board 10 is attached to the base 90, the circuit board 10 and the base 90 are positioned and attached to each other in such a manner that the terminal 1000 connected to the external pad 14 of the circuit board 10 and the through hole 91b for the terminal formed on the base 90 are aligned.

The adhesive 51 surrounds the terminal 1000 and the connection portion between the terminal 1000 and the external pad 14 on the surface of the circuit board facing the mounting surface 92b, and surrounds the position facing the through hole 91b. Specifically, the adhesive is arranged around the terminal 1000, the connection portion between the terminal 1000 and the external pad 14, and the through hole 62 between the circuit board 10 and the mounting surface 92b.

In the present modification, as described above embodiment, a part of the terminal 1000 may be sealed in the insulation substrate (i.e., the thermo-plastic resin 11) of the circuit board 10. In this case, the connection portion between the terminal 1000 and the external pad 14 is separated from the cooling medium with using the insulation substrate (i.e., the thermo-plastic resin 11) of the circuit board 10. Thus, in other words, the adhesive 51 is arranged such that the adhesive 51 on the surface of the circuit board 10 facing the mounting surface 92b surrounds the terminal 1000, and surrounds the position facing the through hole 91b. Specifically, in other words, the adhesive 51 is arranged around the position facing the terminal 1000 and the through hole 91b between the circuit board 10 and the mounting surface 92b.

Thus, the terminal 1000 is arranged in the through hole 91b of the base 90, and separated from the cooling medium in such a manner that the mounting surface 92b of the base 90 and the surface of the circuit board 10 facing the mounting surface 92b are bonded to each other with the adhesive 51. Thus, the terminal 1000 is separated from the cooling medium with using the base 90 and the adhesive 51.

Thus, the circuit board 10 is attached to the housing 60, and the terminal 1000 and the connection portion between the terminal 1000 and the external pad 14 are separated from the cooling medium. Further, a part of the terminal 1000 is arranged on the outside of the housing 60, and the cooling medium is restricted from leaking through the through hole 91b, in which the terminal 1000 formed in the base 90 is inserted.

Further, in the present modification, the circuit board 10 including the insulation substrate having bendability may be used. The circuit board 10 including the insulation substrate having bendability may be attached to the mounting surface 92b of the base 90 to fit the shape of the mounting surface 92b of the base 90. Thus, the circuit board 10 can be attached to the mounting surface 92b of the base 90 without depending on the shape of the mounting surface 92b of the base 90.

Fifth Modification

In the above embodiment, the terminal 1000 and the connection portion between the terminal 1000 and the external pad 14 are separated from the cooling medium with using the adhesive 50 and the insulation substrate (i.e., the thermoplastic resin 11) of the circuit board 10. The present invention is not limited to this feature. As described in the fifth modification in FIG. 10, the terminal 1000 and the connection portion between the terminal 1000 and the external pad 14 may be separated from the cooling medium with using only the insulation substrate (i.e., the thermo-plastic resin 11) of the circuit board 10. The above described second embodiment and the fifth modification have the same description largely, and therefore, the explanation regarding to the same description is skipped. The different features will be mainly explained.

Figure 10:
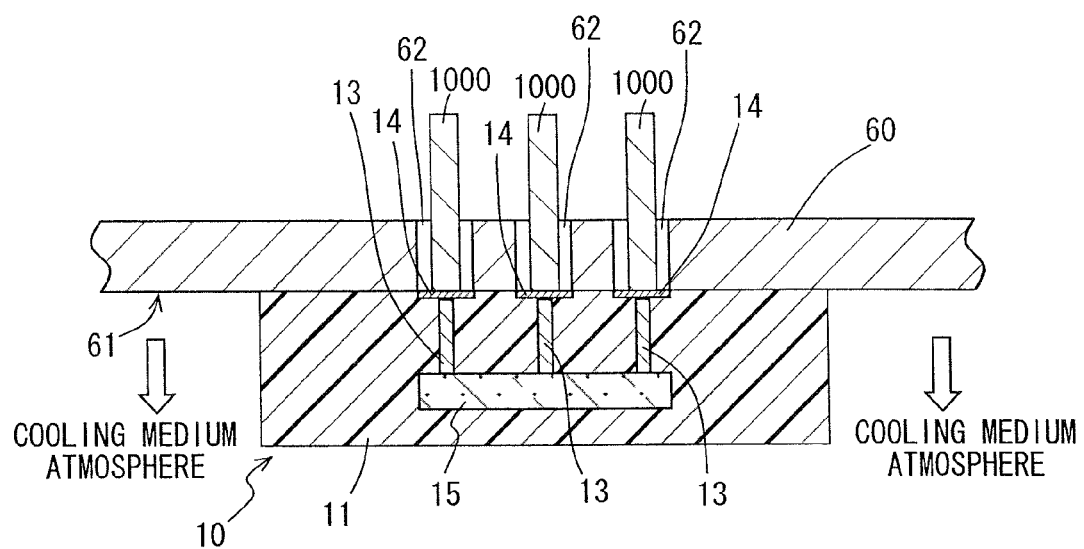
FIG. 10 is a view showing an attachment structure of a circuit board according to a fifth modification.

The circuit board 10 is basically the same as the second embodiment. However, in the circuit board 10 according to the present modification, as shown in FIG. 10, the external pad 14 is formed on the surface of the insulation substrate (i.e., the thermo-plastic resin 11). Specifically, the external pad 14 is formed to expose to the outside of the insulation substrate (i.e., the thermo-plastic resin 11).

Further, the electrode (i.e., the external pad 14 in the present modification) is formed only on the surface of the circuit board 10 facing the inner wall 61 of the housing 60. Specifically, the metal portion (i.e., the external pad 14 as the electrode in the present modification) exposed to the outside of the insulation substrate (i.e., the thermoplastic resin 11) is formed only on the surface of the circuit board 10 facing the inner wall 61 of the housing 60. FIG. 10 is a cross sectional view of a structure such that the circuit board 10 is attached to the housing 60, and corresponds to FIG. 7 of the second embodiment.

Further, the surface of the circuit board 10 facing the inner wall 61 of the housing 60 is formed of the thermo-plastic resin 11. Specifically, the thermo-plastic resin 11 as the separation member is arranged on the surface of the circuit board 10 facing the inner wall 61. The resin 11 surrounds the terminal 1000 and the connection portion between the terminal 1000 and the external pad 14, and surrounds the position facing the through hole 62.

The circuit board 10 is attached to the inner wall 61 of the housing 60 under a condition that a part of the terminal 1000 is arranged to the outside of the housing 60 from the through hole 62, which penetrates the wall of the housing 60. The thermo-plastic resin 11 as the separation member is tightly attached to the inner wall 61 of the housing 60 so that the resin 11 is attached to the inner wall 61 of the housing 60, and the terminal 1000 and the connection portion between the terminal 1000 and the external pad 14 are separated from the cooling medium.

Here, when the circuit board 10 is attached to the inner wall of the housing 60 without using the adhesive or the like additionally, the circuit board 10 is heated, for example, and pressed to the inner wall 61 of the housing so that the board 10 is attached to the inner wall 61. Specifically, the circuit board 10 can be attached to the inner wall 61 of the housing 60 by a thermal compression bonding method. Thus, without using the adhesive and the base, the circuit board 10 is attached to the housing 60, and the terminal 1000 and the connection portion between the terminal 1000 and the external pad 14 are separated from the cooling medium. Further, a part of the terminal 1000 is arranged on the outside of the housing 60, and the cooling medium is restricted from leaking through the through hole 62 formed on the housing 60.

In the present modification, the circuit board including the insulation substrate having bendability may be used. The circuit board 10 including the insulation substrate having bendability is attached to the inner wall of the housing 60 to fit the shape of the inner wall of the housing 60. Thus, the circuit board 10 can be attached to the inner wall 61 of the housing 60 without depending on the shape of the housing 60. Thus, the circuit board 10 is arranged in the housing 60 (i.e., in the cooling medium atmosphere) without increasing the dimensions of the housing 60.

Here, the above described second embodiment and the third to fifth modifications may be combined with the above described first embodiment and the first to second modifications.

The above disclosure has the following aspects.

According to an aspect of the present disclosure, an electric device includes: a circuit board arranged in cooling medium in a housing and having an electric element and an external coupling electrode, wherein the electric element is sealed in and mounted in the board, and the electric element is electrically coupled with the external coupling electrode; an external coupling terminal electrically coupled with the external coupling electrode; and a separation member for separating the external coupling terminal and a connection portion between the external coupling electrode and the external coupling terminal away from the cooling medium.

Thus, since the circuit board is arranged in the cooling medium, the circuit board directly contacts the cooling medium. Accordingly, the cooling performance of the circuit board is improved. Further, since the device includes the separation member for separating the external coupling terminal and the connection portion between the external coupling electrode and the external coupling terminal away from the cooling medium, the external coupling terminal and the connection portion between the circuit board and the external coupling terminal are restricted from contacting the cooling medium. Thus, even when the cooling medium having corrosion action with respect to metal is used, the external coupling terminal and the connection portion between the circuit board and the external coupling terminal are restricted from corroding. Further, even when the cooling medium having conductivity is used, the external coupling terminal and the connection portion between the circuit board and the external coupling terminal are restricted from being conductive with the cooling medium. Accordingly, the cooling performance of the circuit board is improved, and the reliability of the external coupling terminal and the connection portion between the circuit board and the external coupling terminal are improved. Specifically, not only the cooling medium having non-conductivity but also the cooling medium having corrosion action with respect to metal or the cooling medium having conductivity can be used. Thus, a degree of freedom for selecting the cooling medium is improved. Here, since the electric element is mounted on the circuit board under a condition that the electric element is sealed, the reliability of the electric element is not reduced by the cooling medium even when the cooling medium having the corrosion action with respect to metal or the cooling medium having conductivity is used.

Alternatively, the circuit board may include an insulation substrate made of at least thermo-plastic resin and a wiring portion for electrically coupling between the electric element and the external coupling electrode. The electric element and the wiring portion are sealed with the thermo-plastic resin. Thus, the electric element and the wiring portion are easily sealed. Specifically, when the thermo-plastic resin is heated, the thermo-plastic resin melts. When the heating temperature is reduced, the thermo-plastic resin is solidified. Thus, when the thermo-plastic resin is heated and pressurized, the electric element and the wiring portion are easily sealed.

Alternatively, the circuit board may be attached to an inner wall of the housing under a condition that a part of the external coupling terminal is exposed to an outside of the housing from a through hole, which penetrates an wall of the housing. The separation member is made of thermo-plastic resin. The thermo-plastic resin of the separation member is arranged on a surface of the circuit board, which faces the inner wall, surrounds the external coupling terminal and the connection portion, and surrounds a position of the surface of the circuit board facing the through hole. The thermo-plastic resin of the separation member is tightly attached to the inner wall of the housing so that the resin is attached to the inner wall of the housing, and the external coupling terminal and the connection portion are separated from the cooling medium. Thus, the circuit board is attached to the housing, and the external connection terminal and the connection portion are separated from the cooling medium. Further, a part of the external connection terminal is arranged on the outside of the housing, and the cooling medium is restricted from leaking through the through hole, in which the external connection terminal formed in the housing is inserted.

Alternatively, the circuit board may be attached to the inner wall of the housing via the separation member under a condition that a part of the external coupling terminal is exposed to an outside of the housing through the through hole, which penetrates an wall of the housing. The separation member is made of adhesive. The adhesive of the separation member is arranged on a surface of the circuit board facing the inner wall, surrounds the external coupling terminal and the connection portion, and surrounds a position of the surface of the circuit board facing the through hole. The inner wall of the housing and the surface of the circuit board facing the inner wall are bonded to each other with the adhesive so that the external coupling terminal and the connection portion are separated from the cooling medium. Thus, the circuit board is attached to the housing, and the external connection terminal and the connection portion are separated from the cooling medium. Further, a part of the external connection terminal is arranged on the outside of the housing, and the cooling medium is restricted from leaking through the through hole, in which the external connection terminal formed in the housing is inserted.

Alternatively, the circuit board may be attached to an inner wall of the housing via a part of the separation member under a condition that a part of the external coupling terminal is exposed to an outside of the housing through the through hole, which penetrates a wall of the housing. The separation member includes a ring-shaped elastic member and a ring-shaped pressurizing member. The elastic member is arranged on the surface of the circuit board facing the inner wall, surrounds the external coupling terminal and the connection portion, and surrounds a position of the surface of the circuit board facing the through hole. The pressurizing member presses the circuit board on the inner wall so that the circuit board is attached to the housing. The circuit board is pressed to the inner wall with the pressurizing member, and the elastic member is tightly attached to the inner wall of the housing and the surface of the circuit board facing the inner wall so that the external coupling terminal and the connection portion are separated from the cooling medium. Thus, the circuit board is attached to the housing, and the external connection terminal and the connection portion are separated from the cooling medium. Further, a part of the external connection terminal is arranged on the outside of the housing, and the cooling medium is restricted from leaking through the through hole, in which the external connection terminal formed in the housing is inserted. Here, the ring-shaped elastic member may be, for example, a packing such as a O-ring.

Alternatively, the separation member may include a base attached to a wall of the housing and an adhesive. The base seals a first through hole, which penetrates the wall of the housing, and is attached to the wall of the housing. The adhesive bonds the circuit board to a mounting surface of the base, which faces the circuit board. The base of the separation member includes a second through hole, which couples between an inside of the housing and an outside of the housing. The external coupling terminal is arranged in the second through hole under a condition that the circuit board is attached to the housing. The adhesive of the separation member is arranged on the surface of the circuit board, which faces the mounting surface of the base, surrounds the external coupling terminal and the connection portion, and surrounds a position of the surface of the circuit board facing the second through hole. The mounting surface of the base and the surface of the circuit board facing the mounting surface are bonded with the adhesive so that the external coupling terminal and the connection portion are separated from the cooling medium. Thus, the circuit board is attached to the housing, and the external connection terminal and the connection portion are separated from the cooling medium. Further, a part of the external connection terminal is arranged on the outside of the housing, and the cooling medium is restricted from leaking through the through hole, in which the external connection terminal formed in the base is inserted.

Alternatively, the insulation substrate may have bendability. The circuit board is attached to the inner wall of the housing to fit a shape of the inner wall of the housing. Thus, the circuit board is attached to the housing without depending on the shape of the housing. Thus, the circuit board is arranged in the housing without increasing the dimensions of the housing.

Alternatively, the insulation substrate may include a plurality of substrate films made of thermo-plastic resin. The plurality of substrate films are stacked and bonded to each other. Thus, multiple substrate films are stacked under a condition that the electric element and the wiring portion are arranged on the inside of the films, and further, heated and pressurized in the thickness direction of the substrate films, so that the driving circuit is formed.

Alternatively, the insulation substrate may include a substrate film made of thermo-plastic resin and a substrate film made of thermo-setting resin. The substrate film made of thermo-plastic resin provides an adhesive layer. The substrate film made of thermo-plastic resin and the substrate film made of thermo-setting resin are stacked alternately and bonded to each other.

Alternatively, the housing may be a part of an electric compressor. The circuit board is a driving circuit of the electric compressor.

Alternatively, the electric element may include a power device for providing an inverter.

Alternatively, the housing may include a cooling medium suction port and a cooling medium discharge port. An electric motor of the electric compressor; the driving circuit for driving the electric motor; a compression mechanism unit driven by a rotation driving force of the electric motor, sucking the cooling medium from the cooling medium suction port, compressing the cooling medium and discharging the cooling medium through the cooling medium discharge port; and a cooling medium passage, in which the cooling medium flows, disposed between the cooling medium suction port and the compression mechanism unit are disposed in the housing. The driving circuit is arranged in the cooling medium passage.

Alternatively, the electric motor includes: a driving shaft rotatably supported in the housing and transmitting the rotation driving force to the compression mechanism unit; a stator generating a rotation magnetic field with a driving current from the driving circuit and having a stator core arranged on an outside of the driving shaft in a radial direction and a stator coil winded around the stator core; and a rotor arranged on a center side of the driving shaft in the radial direction with respect to the stator core and rotating the driving shaft according to the rotation magnetic field generated by the stator. The cooling medium passage is disposed between the inner wall of the housing and an outer wall of the stator core facing the inner wall of the housing, and extends in an axial direction of the driving shaft. Thus, it is preferred that both of the driving circuit and the electric motor are cooled.

Alternatively, the outer wall of the stator core may include a first concavity. The first concavity is concaved toward the center side of the driving shaft in the radial direction, and extends in the axial direction of the driving shaft. The cooling medium passage is disposed between the inner wall of the housing and the first concavity. Thus, the driving circuit is mounted on the inside of the housing without increasing the dimensions of the electric compressor.

Alternatively, the inner wall of the housing may include a second concavity. The second concavity is concaved toward the outside of the driving shaft in the radial direction, and extends in the axial direction of the driving shaft. The cooling medium passage is disposed between the second concavity and the outer wall of the stator core. Here, the driving circuit is attached to the second concavity. However, as described above, the driving circuit according to the present invention can be deformable comparatively freely. Thus, the shape of the second concavity is not limited specifically, but can be set comparatively freely.

Alternatively, the driving circuit may include an electric element region, in which the electric element is arranged, and a periphery region surrounding the electric element region, in which the electric element is not arranged, on a virtual plane perpendicular to a thickness direction. Thus, when the driving circuit is attached to the housing by the thermal compression bonding method or the like, the compression force with respect to the periphery region is stronger than the compression force with respect to the electric element region so that the bonding force between the driving circuit and the housing is improved, and the stress with respect to the electric element is reduced.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electric device comprising:
    a circuit board arranged in cooling medium in a housing and having an electric element and an external coupling electrode, the circuit board including an insulation substrate made of at least a thermoplastic resin, the electric element being mounted in the board, a wiring portion electrically coupling the electric element with the external coupling electrode, and the electric element and the wiring portion being sealed with the thermoplastic resin;
    an external coupling terminal electrically coupled with the external coupling electrode; and
    a separation member for separating the external coupling terminal and a connection portion between the external coupling electrode and the external coupling terminal and away from the cooling medium,
    wherein the circuit board is attached to an inner wall of the housing under a condition that a part of the external coupling terminal is exposed to an outside of the housing from a through hole, which penetrates a wall of the housing,
    wherein the separation member is made of thermoplastic resin,
    wherein the thermoplastic resin of the separation member is arranged on a surface of the circuit board, which faces the inner wall, surrounds the external coupling terminal and the connection portion, and surrounds a position of the surface of the circuit board facing the through hole, and
    wherein the thermoplastic resin of the separation member is tightly attached to the inner wall of the housing so that the resin is attached to the inner wall of the housing, and the external coupling terminal and the connection portion are separated from the cooling medium.

2. The electric device according to claim 1,
    wherein the insulation substrate has bendability, and
    wherein the circuit board is attached to the inner wall of the housing to fit a shape of the inner wall of the housing.

3. The electric device according to claim 1,
    wherein the insulation substrate includes a plurality of substrate films made of thermoplastic resin, and
    wherein the plurality of substrate films are stacked and bonded to each other.

4. The electric device according to claim 1,
    wherein the insulation substrate includes a substrate film made of thermoplastic resin and a substrate film made of thermosetting resin,
    wherein the substrate film made of thermoplastic resin provides an adhesive layer, and
    wherein the substrate film made of thermoplastic resin and the substrate film made of thermosetting resin are stacked alternately and bonded to each other.

5. The electric device according to claim 1,
    wherein the housing is a part of an electric compressor, and
    wherein the circuit board is a driving circuit of the electric compressor.

6. The electric device according to claim 5,
    wherein the electric element includes a power device for providing an inverter.

7. The electric device according to claim 5,
    wherein the housing includes a cooling medium suction port and a cooling medium discharge port,
    wherein, an electric motor of the electric compressor; the driving circuit for driving the electric motor; a compression mechanism unit driven by a rotation driving force of the electric motor, sucking the cooling medium from the cooling medium suction port, compressing the cooling medium and discharging the cooling medium through the cooling medium discharge port; and a cooling medium passage, in which the cooling medium flows, disposed between the cooling medium suction port and the compression mechanism unit are disposed in the housing, and
    wherein the driving circuit is arranged in the cooling medium passage.

8. The electric device according to claim 7, wherein the electric motor includes:
    a driving shaft rotatably supported in the housing and transmitting the rotation driving force to the compression mechanism unit;
    a stator generating a rotation magnetic field with a driving current from the driving circuit and having a stator core arranged on an outside of the driving shaft in a radial direction and a stator coil winded around the stator core; and
    a rotor arranged on a center side of the driving shaft in the radial direction with respect to the stator core and rotating the driving shaft according to the rotation magnetic field generated by the stator, and
    wherein the cooling medium passage is disposed between the inner wall of the housing and an outer wall of the stator core facing the inner wall of the housing, and extends in an axial direction of the driving shaft.

9. The electric device according to claim 8,
    wherein the outer wall of the stator core includes a first concavity,
    wherein the first concavity is concaved toward the center side of the driving shaft in the radial direction, and extends in the axial direction of the driving shaft, and
    wherein the cooling medium passage is disposed between the inner wall of the housing and the first concavity.

10. The electric device according to claim 8,
    wherein the inner wall of the housing includes a second concavity,
    wherein the second concavity is concaved toward the outside of the driving shaft in the radial direction, and extends in the axial direction of the driving shaft, and
    wherein the cooling medium passage is disposed between the second concavity and the outer wall of the stator core.

11. The electric device according to claim 5,
    wherein the driving circuit includes an electric element region, in which the electric element is arranged, and a periphery region surrounding the electric element region, in which the electric element is not arranged, on a virtual plane perpendicular to a thickness direction.

12. An electric device comprising:
    a circuit board arranged in cooling medium in a housing and having an electric element and an external coupling electrode, the circuit board including an insulation substrate made of at least a thermoplastic resin, the electric element being mounted in the board, a wiring portion electrically coupling the electric element with the external coupling electrode, and the electric element and the wiring portion being sealed with the thermoplastic resin;
    an external coupling terminal electrically coupled with the external coupling electrode; and a separation member for separating the external coupling terminal and a connection portion between the external coupling electrode and the external coupling terminal and away from the cooling medium, wherein the circuit board is attached to the inner wall of the housing via the separation member under a condition that a part of the external coupling terminal is exposed to an outside of the housing through the through hole, which penetrates a wall of the housing, wherein the separation member is made of adhesive, wherein the adhesive of the separation member is arranged on a surface of the circuit board facing the inner wall, surrounds the external coupling terminal and the connection portion, and surrounds a position of the surface of the circuit board facing the through hole, and wherein the inner wall of the housing and the surface of the circuit board facing the inner wall are bonded to each other with the adhesive so that the external coupling terminal and the connection portion are separated from the cooling medium.

13. An electric device comprising:

a circuit board arranged in cooling medium in a housing and having an electric element and an external coupling electrode, the circuit board including an insulation substrate made of at least a thermoplastic resin, the electric element being mounted in the board, a wiring portion electrically coupling the electric element with the external coupling electrode, and the electric element and the wiring portion being sealed with the thermoplastic resin;

an external coupling terminal electrically coupled with the external coupling electrode; and a separation member for separating the external coupling terminal and a connection portion between the external coupling electrode and the external coupling terminal and away from the cooling medium, wherein the circuit board is attached to an inner wall of the housing via a part of the separation member under a condition that a part of the external coupling terminal is exposed to an outside of the housing through the through hole, which penetrates a wall of the housing, wherein the separation member includes a ring-shaped elastic member and a ring-shaped pressurizing member, wherein the elastic member is arranged on the surface of the circuit board facing the inner wall, surrounds the external coupling terminal and the connection portion, and surrounds a position of the surface of the circuit board facing the through hole, and wherein the pressurizing member presses the circuit board on the inner wall so that the circuit board is attached to the housing, and wherein the circuit board is pressed to the inner wall with the pressurizing member, and the elastic member is tightly attached to the inner wall of the housing and the surface of the circuit board facing the inner wall so that the external coupling terminal and the connection portion are separated from the cooling medium.

14. An electric device comprising:

a circuit board arranged in cooling medium in a housing and having an electric element and an external coupling electrode, the circuit board including an insulation substrate made of at least a thermoplastic resin, the electric element being mounted in the board, a wiring portion electrically coupling the electric element with the external coupling electrode, and the electric element and the wiring portion being sealed with the thermoplastic resin;

an external coupling terminal electrically coupled with the external coupling electrode; and a separation member for separating the external coupling terminal and a connection portion between the external coupling electrode and the external coupling terminal and away from the cooling medium, wherein the separation member includes a base attached to a wall of the housing and an adhesive, wherein the base seals a first through hole, which penetrates the wall of the housing, and is attached to the wall of the housing, wherein the adhesive bonds the circuit board to a mounting surface of the base, which faces the circuit board, wherein the base of the separation member includes a second through hole, which couples between an inside of the housing and an outside of the housing, wherein the external coupling terminal is arranged in the second through hole under a condition that the circuit board is attached to the housing, wherein the adhesive of the separation member is arranged on the surface of the circuit board, which faces the mounting surface of the base, surrounds the external coupling terminal and the connection portion, and surrounds a position of the surface of the circuit board facing the second through hole, and wherein the mounting surface of the base and the surface of the circuit board facing the mounting surface are bonded with the adhesive so that the external coupling terminal and the connection portion are separated from the cooling medium.

* * * * *